US012687570B2

(12) United States Patent
Yoon

(10) Patent No.: US 12,687,570 B2
(45) Date of Patent: Jul. 21, 2026

(54) INSULATION MONITORING DEVICE AND METHOD FOR CONTROLLING INSULATION MONITORING DEVICE

(71) Applicant: LS ELECTRIC CO., LTD., Anyang-si (KR)

(72) Inventor: Jaeshik Yoon, Anyang-si (KR)

(73) Assignee: LS ELECTRIC CO., LTD., Anyang-si (KR)

( * ) Notice: Subject to any disclaimer, the term of this patent is extended or adjusted under 35 U.S.C. 154(b) by 173 days.

(21) Appl. No.: 18/683,099

(22) PCT Filed: Oct. 12, 2022

(86) PCT No.: PCT/KR2022/015410
§ 371 (c)(1),
(2) Date: Feb. 12, 2024

(87) PCT Pub. No.: WO2023/085616
PCT Pub. Date: May 19, 2023

(65) Prior Publication Data
US 2024/0353466 A1 Oct. 24, 2024

(30) Foreign Application Priority Data

Nov. 15, 2021 (KR) ........................ 10-2021-0156898

(51) Int. Cl.
*G01R 31/12* (2020.01)
*G01R 19/00* (2006.01)
(Continued)

(52) U.S. Cl.
CPC ....... *G01R 31/1272* (2013.01); *G01R 19/003* (2013.01); *G01R 19/16576* (2013.01);
(Continued)

(58) Field of Classification Search
CPC ............ G01R 31/1272; G01R 31/2841; G01R 31/52; G01R 31/54; G01R 31/66;
(Continued)

(56) References Cited

U.S. PATENT DOCUMENTS

2016/0252557 A1 9/2016 Li
2016/0315461 A1* 10/2016 Pieler ........................ H02H 3/16
(Continued)

FOREIGN PATENT DOCUMENTS

CN 102798790 A 11/2012
CN 110554239 A 12/2019
(Continued)

OTHER PUBLICATIONS

International Search Report for related International Application No. PCT/KR2022/015410; action dated May 19, 2023; (2 pages).
(Continued)

*Primary Examiner* — Lee E Rodak
*Assistant Examiner* — Demetrius R Pretlow
(74) *Attorney, Agent, or Firm* — K&L Gates LLP

(57) ABSTRACT

An insulation monitoring device is provided with a signal generation unit generating a measurement signal having a preset voltage and applying the measurement signal to the ground; a signal detection unit including a coupler resistor connected to a transmission line and a detection resistor provided between the coupler resistor and the other end of the signal generation unit, and detecting the voltage of the measurement signal distributed to the internal resistance of the insulation monitoring device according to the voltage difference across the detection resistor; and a control unit detecting a transient voltage, due to the charging and discharging of a system capacitor and generated by parasitic capacitance between the transmission line and ground, from the voltage detected by the signal detection unit, and check-
(Continued)

ing the connection state of the insulation monitoring device to the transmission line and ground based on the result of detecting the transient voltage.

21 Claims, 10 Drawing Sheets

(51) Int. Cl.

| | |
|---|---|
| *G01R 19/165* | (2006.01) |
| *G01R 27/02* | (2006.01) |
| *G01R 31/28* | (2006.01) |
| *G01R 31/52* | (2020.01) |

(52) U.S. Cl.
CPC ....... *G01R 27/025* (2013.01); *G01R 31/2841* (2013.01); *G01R 31/52* (2020.01)

(58) Field of Classification Search
CPC ...... G01R 31/12; G01R 31/083; G01R 31/58; G01R 19/003; G01R 19/16576; G01R 19/10; G01R 19/16571; G01R 27/025; G01R 35/00
See application file for complete search history.

(56) References Cited

U.S. PATENT DOCUMENTS

2016/0377670 A1* 12/2016 Tamida .................. G01R 31/52
324/551

2020/0110122 A1 4/2020 Wakimoto et al.
2021/0231717 A1 7/2021 Hackl et al.

FOREIGN PATENT DOCUMENTS

| | | | |
|---|---|---|---|
| DE | 102015207456 | B3 | 9/2016 |
| EP | 4242674 | A1 | 9/2023 |
| IN | 201828047417 | A | 5/2019 |
| JP | 05081742 | U | 11/1993 |
| JP | 5681889 | B2 | 3/2015 |
| KR | 101406546 | B1 | 6/2014 |
| KR | 101610921 | B1 | 4/2016 |
| KR | 101748554 | B1 | 6/2017 |
| KR | 102204013 | B1 | 1/2021 |
| KR | 102214120 | B1 | 2/2021 |
| KR | 102222722 | B1 | 3/2021 |

OTHER PUBLICATIONS

Written Opinion for related International Application No. PCT/KR2022/015410; action dated May 19, 2023; (4 pages).
Office Action for related Korean Application No. 10-2021-0156898; action dated Oct. 10, 2023; (11 pages).
Office Action for related Chinese Application No. 202280039962.0; action dated Mar. 20, 2026; (6 pages).
Extended European Search Report for related European Application No. 22893039.2; action dated Oct. 20, 2025; (6 pages).

* cited by examiner

START

GENERATE AND OUTPUT MEASUREMENT SIGNAL — S200

DETECT RECEPTION SIGNAL VOLTAGE — S202

DETECT NORMAL-STATE RECEPTION SIGNAL VOLTAGE — S204

IS TRANSIENT VOLTAGE DUE TO SYSTEM CAPACITOR DETECTED FOR PRESET TIME ? — S206

YES

NO

TRANSMIT ALERTING INFORMATION FOR ALERTING THAT CONNECTED STATE OF INSULATION MONITORING DEVICE IS ABNORMAL — S208

END

INSULATION MONITORING DEVICE AND METHOD FOR CONTROLLING INSULATION MONITORING DEVICE

CROSS-REFERENCE TO RELATED APPLICATIONS

This application is the National Stage filing under 35 U.S.C. 371 of International Application No. PCT/KR2022/015410, filed on Oct. 12, 2022, which claims the benefit of earlier filing date of and rights of priority to Korean Application 10-2021-0156898, filed on Nov. 15, 2021, the contents of which are all hereby incorporated by reference herein in their entirety.

FIELD

The present disclosure relates to an insulation monitoring device and a method of controlling the insulation monitoring device, the apparatus and the method being capable of detecting in advance a grounding accident or the like in an isolated terra (IT) electric power system.

BACKGROUND

The isolated terra (IT) technique is a grounding technique in which grounding is performed through only an enclosure of a load, without any side of a transmission line being grounded. A problem with the electric power system employing this IT technique is that the grounding detection device for use in the grounding system has difficulties detecting a grounding failure because a very small amount of failure current flows when the grounding failure occurs. Particularly, in the case of the DC system for use in the solar system, the energy storage system (ESS), or the like, the insulation monitoring device (IMD) has received attention as the device for measuring the insulation state of this IT electric power system.

The typical IMD is formed between the ground and the transmission line and measures an insulation state between the ground and the transmission line by measuring the resistance of an imaginary insulation resistance formed between the transmission line and the ground. To this end, the IMD is configured to include a signal generation unit generating a signal to be applied to the ground through grounding, and a detection resistor for detecting a voltage of the signal generated in the signal generation unit. Moreover, the IMD is configured to detect the insulation state between the transmission line and the ground by detecting a difference between voltages of both ends of the detection resistor and computing the resistance of the insulation resistance.

The IMD, as described above, determines the insulation state between the transmission line and the ground through the resistance of the insulation resistance. When a voltage (voltage detected through the detection resistor) lowered by the insulation resistance has an increasing magnitude, that is, when the insulation resistance has decreasing resistance, the IMD determines that the insulation state becomes poorer. In a case where the resistance of the insulation resistance is at or below a predetermined value, the IMD determines that the insulation state has collapsed and thus the grounding occurs. Conversely, when the detected voltage has a decreasing magnitude, that is, when the insulation resistance has increasing resistance, the IMD determines that the insulation state becomes satisfactory.

However, in a case where the connection of the IMD to the transmission line or the ground is disrupted, for example, in a case where a connection between the IMD and the transmission line or between a connection between the IMD and the ground is disrupted, a circuit that connects the transmission line and the ground, which are connected through the insulation resistance, to the IMD may be open. However, the resistance between both ends of the circuit in which the connection is disrupted may be infinite. In this case, the voltage of the signal generated in the signal generation unit may not be detected due to this disruption of the connection. This situation is very similar to the case where the resistance of the insulation resistance is significantly high, that is, the case where an insulated state of the transmission line is satisfactory.

Therefore, there occurs a problem in that the typical IMD does not detect the case where the connection among the transmission line, the ground, and the typical IMD is disrupted and the case where the connection between the transmission line or the ground, and the typical IMD is disrupted. In addition, in a case where the connection among the transmission line, the ground, and the typical IMD is disrupted and in a case where the connection between the transmission line or the ground, and the typical IMD is disrupted, there occurs a problem in that the insulated state of the transmission line can be monitored due to the influence of the disruption of the connection. That is, in practice, in a case where the grounding occurs due to dielectric breakdown, it is also determined that the disconnected IMD has a high resistance. Because of this, there occurs a problem in that the insulated state of the transmission line is erroneously determined to be excellent.

SUMMARY

Therefore, to obviate those problems, an aspect of the detailed description is to provide an insulation monitoring device and a method of controlling the insulating monitoring device, the device and the method being capable of detecting whether or not a connection between transmission line and the insulating monitoring is disrupted, by checking a connected state of the insulating monitoring device to the transmission line.

Another aspect of the detailed description is to provide an insulation monitoring device and a method of controlling the insulating monitoring device, the device and the method being capable of checking a connected state of the insulation monitoring device to each of a plurality of transmission lines.

Still another aspect of the detailed description is to provide an insulation monitoring device and a method of controlling the insulating monitoring device, the device and the method being capable of detecting whether or not a connection between the ground and an insulation monitoring device is disrupted, by checking a connected state of the insulation monitoring device to the ground.

Yet another aspect of the detailed description is to provide an insulation monitoring device and a method of controlling the insulating monitoring device, the device and the method being capable of checking a connection between a load and an enclosure in a state where the insulation monitoring device is separated from an isolated terra (IT) electric power system and notifying a manager of the connected state of the insulation monitoring device to the enclosure of the load.

To achieve these and other advantages and in accordance with the purpose of the present disclosure, as embodied and broadly described herein, there is provided an insulation monitoring device including: a signal generation unit configured to generate a measurement signal having a preset voltage and to apply the measurement signal to the ground through a protective earth connected to one end thereof; a coupler resistor connected to a transmission line; a signal detection unit including a detection resistor provided between the coupler resistor and the other end of the signal generation unit and configured to detect a voltage of the measurement signal that is distributed to the internal resistance of the insulation monitoring device, the internal resistance being formed by the resistance of the coupler resistor and the resistance of the detection resistor according to a difference between voltages of both ends of the detection resistor; and a control unit configured to detect, from the voltage detected in the signal detection unit, a transient voltage due to charging and discharging of a system capacitor formed by parasite capacitance between the transmission line and the ground, and to check a connected state of the insulation monitoring device to the transmission line and the ground, based on the result of detecting the transient voltage.

In the insulation monitoring device, the control unit may detect a normal-state voltage from the voltage detected in the signal detection unit and may detect, as the transient voltage, a voltage that is higher, by a preset magnitude or greater, than the detected normal-state voltage.

In the insulation monitoring device, the control unit may detect, with a period of the preset time, the transient voltage from the voltage detected in the signal detection unit, and the preset time may be determined at least one of the following: a shape of the measurement signal or a period of the measurement signal.

In the insulation monitoring device, the control unit may determine sampling periods of time that vary with a preset time constant, may compute average voltages of voltages that are detected in the signal detection unit during the sampling periods of time, respectively, and may detect the normal-state voltage based on a difference between the computed average voltages.

In the insulation monitoring device, in a case where the voltage that is higher, by the preset magnitude or greater, than the normal-state voltage is detected, the control unit may detect whether or not a magnitude of the detected voltage changes by a predetermined magnitude or greater for a predetermined time, and may determine, further based on a change in the magnitude of the detected voltage, whether or not the transient voltage occurs.

The insulation monitoring device may further include a communication unit configured to establish a connection to a preset server or terminal for communication, wherein, based on the result of detecting the transient voltage, the control unit may control the communication unit in such a manner as to transmit alerting information for alerting that the connected state of the insulation monitoring device is abnormal, to the server or terminal.

To achieve these and other advantages and in accordance with the purpose of the present disclosure, as embodied and broadly described herein, there is provided a method of controlling an insulation monitoring device for measuring the resistance of an insulation resistance between a transmission line and the ground, the method including steps of: generating a measurement signal having a preset voltage and applying the measurement signal to the ground; detecting, based on the resistance of a preset detection resistor, a voltage of the measurement signal that is distributed to the internal resistance of the insulation monitoring device, the internal resistance being formed by the resistance of a coupler resistor, connected to the transmission line, and the resistance of the detection resistor; determining whether or not a voltage detected through the detection resistor is a normal-state voltage; detecting whether or not a transient voltage occurs, from a voltage that is detected through the detection resistor for a preset time, in a case where the voltage detected through the detection resistor is the normal-state voltage; and determining a connected state of the insulation monitoring device to the transmission line and the ground, based on whether or not the transient voltage occurs.

In the method, the step of detecting whether or not the transient voltage occurs may include steps of: computing a voltage difference between the voltage detected through the detection resistor and the normal-state voltage; comparing the computed voltage difference and a voltage value of preset magnitude; determining that the transient voltage occurs, in a case where, as a result of the comparison, the computed voltage difference is at or above the voltage value of preset magnitude; and determining that the transient voltage does not occur, in a case where, as a result of the comparison, the computed voltage difference is below the voltage value of preset magnitude.

In the method, the step of determining whether or not the voltage detected through the detection resistor is the normal-state voltage may include steps of: determining a sampling period of time that varies with a preset time constant; computing an average voltage of voltages that are detected during the sampling periods of time; computing a difference between the average voltage and an average voltage of voltages that are detected during the preceding sampling period of time; comparing the computed difference and a preset error; and determining, as the normal-state voltage, the average voltage of the voltages detected during the sampling period of time, or reperforming the step of computing the sampling period of time, the step of computing the average voltage, the step of computing the difference between the average voltages, and the step of comparing the computed difference and the preset error, based on the result of the comparison.

In the method, the step of determining the connected state of the insulation monitoring device to the transmission line and the ground may include a step of transmitting alerting information for alerting that the connected state of the insulation monitoring device is abnormal, to a preset server or terminal, in a case where the transient voltage does not occur for the preset time.

To achieve these and other advantages and in accordance with the purpose of the present disclosure, as embodied and broadly described herein, there is provided an insulation monitoring device for measuring the resistance of an insulation resistance between a transmission line and the ground, the insulation monitoring device including: a signal generation unit configured to generate a measurement signal having a preset voltage and to apply the measurement signal to the ground through a protective earth connected to one end thereof; a coupler resistor connected to the transmission line; a signal detection unit including a detection resistor provided between the coupler resistor and the other end of the signal generation unit and configured to detect a voltage of the measurement signal that is distributed to the internal resistance of the insulation monitoring device, the internal resistance being formed by the resistance of the coupler resistor and the resistance of the detection resistor according to a difference between voltages of both ends of the detection resistor; a circuit opening and closing switch configured to connect between the coupler resistor and the detection resistor and to disable a connection between the coupler resistor and the detection resistor; and a control unit configured to control the circuit opening and closing switch, to detect whether or not a second voltage that is detected in the signal detection unit in a state where the coupler resistor and the detection resistor are connected by the circuit opening and closing switch contains a transient voltage, based on a first voltage that is detected in the signal detection unit in a state where the connection between the coupler resistor and the detection resistor is disabled by the circuit opening and closing switch, and to check the connected state of the insulating monitoring device to the transmission line and the ground, based on the result of detecting the transient voltage.

In the insulation monitoring device, the first voltage may be a preset offset voltage that is applied to the signal detection unit, and, in a case where the second voltage is higher, by a preset voltage value or higher, than the offset voltage, the control unit may determine that the second voltage contains the transient voltage.

In the insulation monitoring device, the transmission line may include a plurality of lines, the coupler resistors may be connected to the plurality of lines, respectively, and the circuit opening and closing switch may be configured as a plurality of switches that are formed between the different coupler resistors and the detection resistor, respectively, the coupler different resistors being connected to the plurality of lines, respectively.

In the insulation monitoring device, by controlling all the switches, the control unit may detect, as the first voltage, a voltage that is detected through the signal detection unit in a state where the connection between each of the coupler resistors and the detection resistor is disabled, may connect between a first coupler resistor connected to a first switch and the detection resistor by selecting the first switch from among the plurality of switches and controlling the first switch, may detect, as the second voltage, a voltage that is detected from the voltage detected in the signal detection unit when the first coupler resistor and the detection resistor are connected to each other, may detect whether or not the second voltage contains the transient voltage, based on the first voltage, and may check a connected state of the insulation monitoring device to one of the plurality of lines connected to the first coupler resistors, respectively, based on whether or not the second voltage contains the transient voltage.

The insulation monitoring device may further include a communication unit configured to establish a connection to a preset server or terminal for communication, wherein the control unit may control the communication unit in such a manner as to transmit alerting information for alerting that the connected state of the insulation monitoring device is abnormal, to the server or terminal, based on the result of detecting the transient voltage, and the alerting information may include information on the connected state of the insulation monitoring device to one of the plurality of lines.

The insulation monitoring device may further include: an enclosure terminal connected to an enclosure of a load; and an enclosure grounding switch connected to the detection resistor and connecting between the enclosure terminal and the detection resistor or disabling the connection between the detection resistor and the enclosure terminal.

In the insulation monitoring device, the control unit may control the enclosure grounding switch in such a manner that the connection between the enclosure terminal and the detection resistor is disabled, in a state where the connection between the coupler resistor and the detection resistor is disabled by the circuit opening and closing switch, the control unit may detect an offset voltage based on a voltage that is detected through the signal detection unit in a state where the connection between the enclosure terminal and the detection resistor is disabled, and the control unit may control the enclosure grounding switch in such a manner to connect between the enclosure terminal and the detection resistor, in a state where the connection between the coupler resistor and the detection resistor is disabled, and may further check a connected state of the insulating monitoring device to the enclosure of the load based on the result of comparing a voltage detected through the signal detection unit in a state where the enclosure terminal and the detection resistor are connected and the offset voltage.

To achieve these and other advantages and in accordance with the purpose of the present disclosure, as embodied and broadly described herein, there is provided a method of controlling an insulating monitoring device including a circuit opening and closing switch enabling and disabling a connection between a coupler resistor connected to a transmission line and a preset detection resistor, and a signal detection unit including the preset detection resistor.

The method includes steps of: generating a measurement signal having a preset voltage and applying the measurement signal to the ground; disabling a connection between the coupler resistor and the preset detection resistor by controlling the circuit opening and closing switch; detecting an offset voltage based on a voltage detected in the signal detection unit, in a case where the connection between the coupler resistor and the preset detection resistor is disabled; connecting between the coupler resistor and the preset detection resistor by controlling the circuit opening and closing switch; and detecting whether or not the voltage detected through the signal detection unit contains a transient voltage, based on the offset voltage, and determining a connected state of the insulation monitoring device to the transmission line and the ground, based on whether or not the voltage detected through the signal detection unit contains the transient voltage.

In the method, the insulation monitoring device may further include: an enclosure terminal connected to an enclosure of a load; and an enclosure grounding switch connected to the preset detection resistor and connecting between the enclosure terminal and the preset detection resistor or disabling the connection between the preset detection resistor and the enclosure terminal, and the step of disabling the connection between the coupler resistor and the preset detection resistor may include steps of: disabling the connection between the enclosure terminal and the preset detection resistor by controlling the enclosure grounding switch, in a state where the connection between the coupler resistor and the preset detection resistor is disabled; detecting the offset voltage based on the voltage detected through the signal detection unit; connecting between the enclosure terminal and the preset detection resistor by controlling the enclosure grounding switch; comparing the voltage detected through the signal detection unit and the offset voltage; and checking a connected state of the insulation monitoring device to the enclosure of the load based on the result of the comparison.

In the method, the transmission line may include a plurality of lines, the coupler resistors may be connected to the plurality of lines, respectively, and the circuit opening and closing switch may be configured as a plurality of switches that are formed between the different coupler resistors and the preset detection resistor, respectively, the different coupler resistors being connected to the plurality of lines, respectively. Furthermore, in the method, the step of connecting the coupler resistor and the preset detection resistor may be a step of sequentially selecting one switch from among the plurality of switches and controlling the selected switch in such a manner as to connect between the coupler resistor connected to the selected switch and the preset detection resistor. Additionally, in the method, the step of determining the connected state of the insulation monitoring device to the transmission line and the ground may be a step of determining a connected state of the insulation monitoring device to one of the plurality of lines, which is connected to a specific coupler resistor, based on whether or not whether or not the voltage detected in the signal detection unit contains the transient voltage, when the specific coupler resistor and the preset detection resistor are connected to each other.

In the method, the step of determining the connected state of the insulation monitoring device to the transmission line and the ground may include a step of transmitting alerting information for alerting that the connected state of the insulation monitoring device is abnormal, to a preset server or terminal, based on whether or not the voltage detected in the signal detection unit contains the transient voltage, and the alerting information may include information on a connected state of the insulation monitoring device to each of the plurality of lines.

In accordance with the detailed description, the following advantageous effects can be provided.

The advantageous effect of detecting whether or not a connection between a transmission line and the insulation monitoring device or between the ground and the insulation monitoring device is disrupted can be achieved, thereby preventing erroneous detection of an insulated state of the transmission line due to the disruption of the connection.

In addition, the advantageous effect of notifying a manager of the disruption of the connection between the transmission line and the insulation monitoring device or between the ground and the insulation monitoring device when the disruption is detected can be achieved. Thus, the manager can recognize a state where the insulation monitoring device cannot detect grounding in an isolated terra (IT) electric power system due to the disruption of the connection.

In addition, the advantageous effect of detecting disruption of a connection between one of a plurality of transmission lines and the insulation monitoring device even when the disruption occurs can be achieved. This detection is made possible by detecting a state of the connection between one of the plurality of transmission lines and the insulation monitoring device.

In addition, the advantageous effect of preventing an electric shock accident resulting from an enclosure of a load when an electric leakage accident occurs can be achieved. This prevention is made possible by checking a connection between the insulation monitoring device and an enclosure of a load and notifying the manager of a state of the connection between the insulation monitoring device and the enclosure of the load.

DETAILED DESCRIPTION

It should be noted that the technical terms used in this specification are only used to describe specific embodiments and are not intended to limit the present disclosure. A singular representation used herein may include a plural representation unless it represents a definitely different meaning from the context. In general, a suffix such as "module" and "unit" may be used to refer to elements or components. Use of such a suffix herein is merely intended to facilitate description of the specification, and the suffix itself is not intended to give any special meaning or function.

In this application, the terms "comprising" and "including" should not be construed to necessarily include all of the elements or steps disclosed herein, and should be construed not to include some of the elements or steps thereof, or should be construed to further include additional elements or steps.

In describing the present disclosure, if a detailed explanation for a related known function or construction is considered to unnecessarily divert the gist of the present disclosure, such explanation has been omitted but would be understood by those skilled in the art.

The accompanying drawings are used to help easily understand the technical idea of the present disclosure and it should be understood that the idea of the present disclosure is not limited by the accompanying drawings. The idea of the present disclosure should be construed to extend to any alterations, equivalents and substitutes besides the accompanying drawings. It should also be understood that each of embodiments described below and combinations of those embodiments are all changes, equivalents, or substitutes which can belong to the idea and scope of the present disclosure.

Figure 1:
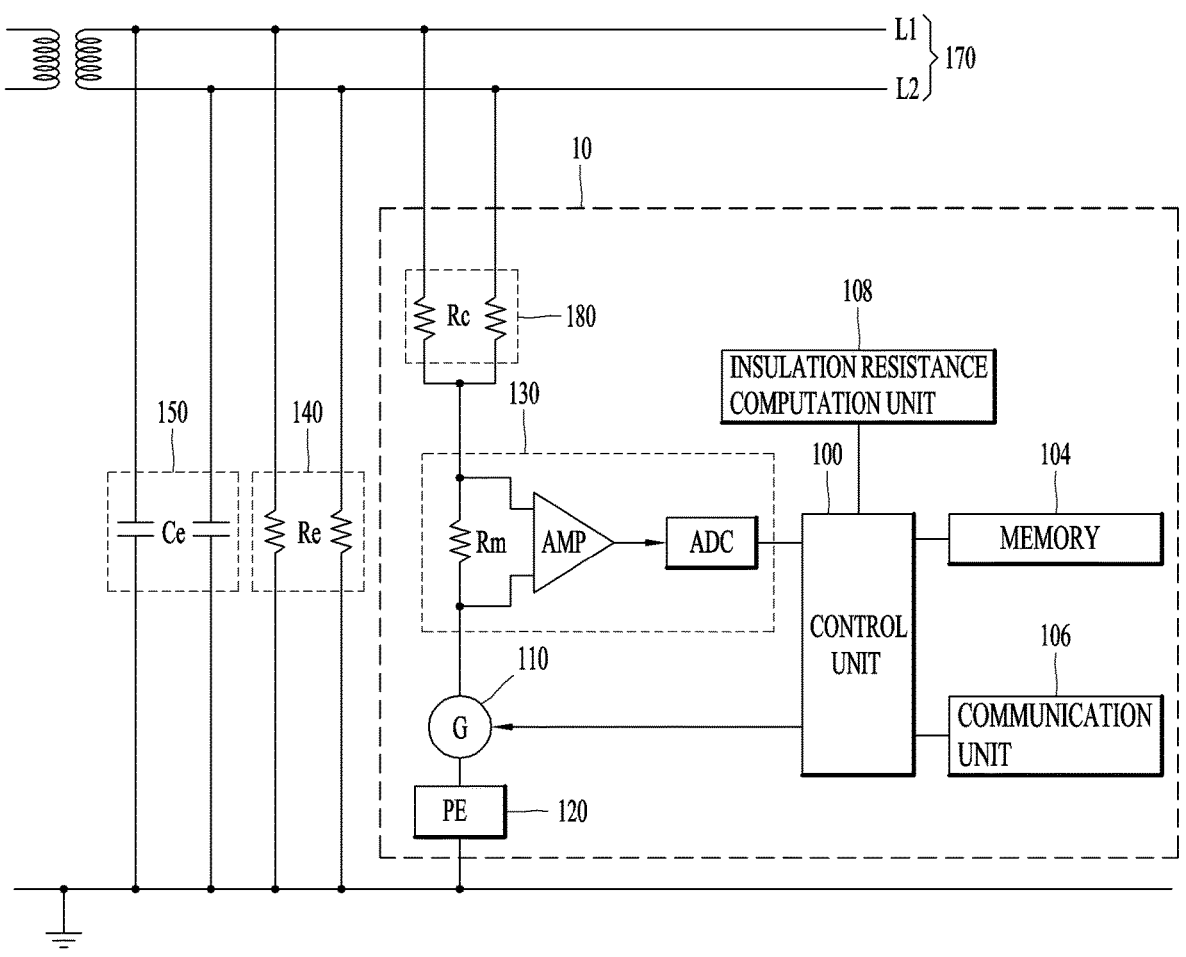
FIG. 1 is a block diagram illustrating a configuration of an insulation monitoring device according to a first embodiment of the present disclosure.

FIG. 1 is a block diagram illustrating a configuration of an insulation monitoring device 10 according to a first embodiment of the present disclosure.

With reference to FIG. 1, the insulation monitoring device 10 according to the first embodiment of the present disclosure may include a control unit 100, a signal generation unit 110 connected to the control unit 100, a signal detection unit 130 including a detection resistor Rm, an insulation resistance computation unit 108, and a memory 104. The insulation monitoring device 10 may further include a communication unit 106.

One end of the signal generation unit 110 here may be connected to a protective earth (PE) 120 that connects between one end of the signal generation unit 110 and the ground. The other end of the signal generation unit 110 may be connected to the detection resistor Rm. The detection resistor Rm may be connected to resistors that are respectively connected to transmission lines L1 and L2, that constitute a transmission line 170, that is, may be connected to coupler resistors Rc (which constitute a coupler resistor 180).

Constituent elements of the insulation monitoring device 10, which are illustrated in FIG. 1, are not necessarily essential to constitute the insulation monitoring device 10. The insulation monitoring device 10 described in the present specification may include one or more other constituent elements in addition to the constituent elements mentioned above or may omit one or more constituent elements from among the constituent elements mentioned above.

First, under the control of the control unit 100, the signal generation unit 110 may generate a measurement signal with a preset positive (+) or negative (−) voltage Up. In this case, the signal generation unit 110 may generate a signal in the shape of a square wave. The signal generation unit 110 may be connected to the ground through the protective earth 120. Therefore, the measurement signal generated in the signal generation unit 110 may be applied to the ground.

As described above, an electric power system is a system in which grounding is performed only through an enclosure of a load without any side of the transmission line 170 being grounded. An insulation resistance Re is present between the transmission line L1 and the ground and between the transmission line L2 and the ground, respectively. The transmission line L1 and the transmission line L2 constitute the transmission line 170. The insulation resistance 140 may be a resistance of an imaginary resistor that is present between the transmission line 170 and the ground, that is, between the transmission line 170 and the earth. In addition, the transmission line 170 is a conductor, and the ground is also a conductor. Consequently, a parasitic capacitance component formed between the conductors may be present. System capacitors Ce (which constitute a system capacitor 150) in FIG. 1 may refer to parasitic capacitance components that are each formed in this manner between the transmission line 170 and the ground.

In this case, the transmission line 170 and the ground may be connected to each other through the insulation resistance 140. In addition, the ground may be connected to one end of the signal generation unit 110 through the protective earth 120, and the transmission line 170 may be connected to the other end of the signal generation unit 110 through the coupler resistor 180 and the detection resistor Rm. Therefore, a circuit may be formed by connecting the ground, the protective earth 120, the signal generation unit 110, the detection resistor Rm, the coupler resistor 180, the transmission line 170 and the insulation resistance 140, and by connecting the insulation resistance 140 back to the ground. A circuit that is formed to include the insulation resistance 140 and the transmission line 170 that are connected through the ground is hereinafter referred to as an insulation circuit.

Therefore, along this insulation circuit, a measurement signal applied to the ground may flow through the insulation resistance 140 and then be applied to the transmission line 170. Then, the measurement signal may be applied to the coupler resistor 180, connected to the transmission line 170, and the detection resistor Rm. Therefore, a voltage Up of the measurement signal flows through the insulation resistance 140, the coupler resistor 180, and the detection resistor Rm may be detected in the signal detection unit 130 using the detection resistor Rm.

The resistance of the coupler resistor 180 and the resistance of the detection resistor Rm, that is, the internal resistance Ri of the insulation monitoring device 10 and the insulation resistance 140 may form a composite resistance. The voltage Up of the measurement signal may be lowered by the composite resistance. Therefore, a voltage lower than the voltage Up of the measurement signal may be detected by the signal detection unit 130. A signal with a voltage lowered by the composite resistance, which is formed by the resistance of the insulation resistance Rm and the internal resistance Ri of the insulation monitoring device 10, is hereinafter referred to as a reception signal. A voltage that is detected in the signal detection unit 130 is hereinafter referred to as a reception signal voltage Um.

As described above, the internal resistance Ri of the insulation monitoring device 10 and the insulation resistance 140 forms the composite resistance. Consequently, the reception signal voltage Um may be the same as the voltage Up of the measurement signal, which is distributed to the internal resistance Ri of the insulation monitoring device 10 in proportion to a ratio of the insulation resistance 140 and the internal resistance Ri.

The signal detection unit 130 may be configured to include the detection resistor Rm, an amplification unit, and an analog-to-digital converter (ADC). The amplification unit serves to amplify voltages of both ends of the detection resistor Rm to a measurable voltage level. The analog-to-digital converter serves to convert an analog value of the amplified voltage into a digital value. The control unit 100, which receives the reception signal voltage Um with the digital value that results from the conversion by the signal detection unit 130, may input the received reception signal voltage Um into the insulation resistance computation unit 108 and may compute the insulation resistance 140 through the insulation resistance computation unit 108.

Under the control of the control unit 100, the insulation resistance computation unit 108 may compute the insulation resistance 140. More specifically, the insulation resistance computation unit 108 may compute the insulation resistance

140 based on the assumption that the reception signal voltage Um is a voltage that is distributed to the internal resistance Ri of the insulation monitoring device 10 in proportion to the ratio of the insulation resistance 140 and the internal resistance Ri.

In this case, the insulation resistance 140 is not known, but the resistances of the coupler resistor 180 and the resistance of the detection resistor Rm, which form the composite resistance, may be determined according to the specifications of the insulation monitoring device 10. Consequently, the insulation resistance computation unit 108 may inversely compute the insulation resistance 140 based on the magnitude of the detected reception signal voltage Um, the internal resistance Ri, and the voltage Up of the measurement signal. The computed resistance of the insulation resistance 140 may be returned to the control unit 100.

Data, necessary to support various functions of the insulation monitoring device 10, are stored in the memory 104. Data and commands for operation of the insulation monitoring device 10 may be stored in the memory 104. In addition, data that are to be input into the control unit 100 and data that are output from the control unit 100 may be stored temporarily or permanently in the memory 104. As an example, data for controlling the insulation resistance computation unit 108 may be stored in the memory 104. Examples of the data may include information associated with the resistance of the coupler resistor 180, the resistance of the detection resistor Rm, and the voltage Up of the measurement signal, and information associated with the reception signal voltage Um received in the signal detection unit 130.

The communication unit 106 may establish a connection to a preset server or terminal for communication. The terminal here refers to a terminal used by a manager to manage the insulation monitoring device 10. Examples of such a terminal may include mobile phones, smartphones, laptop computers, personal digital assistants (PDAs), slate PCs, tablet PCs, ultrabook computers, wearable devices, and the like.

The control unit 100 may determine a state of insulation between the transmission line 170 and the ground according to the insulation resistance 140 that is computed in the insulation resistance computation unit 108. As an example, in a case where the computed resistance of the insulation resistance 140 is at or above a preset value, the control unit 100 may determine that the state of the insulation between the transmission line 170 and the ground is satisfactory. However, in a case where the insulation resistance 140 is blow the preset value, the control unit 100 may determine that the state of the insulation between the transmission line 170 and the ground is poor. In this case, when the state of the insulation is at or below a predetermined level, the control unit 100 may determine that a grounding accident may occur, and, through the communication unit 106, may notify the manager of a state where dielectric breakdown may exist.

The control unit 100 of the insulation monitoring device 10 according to the first embodiment of the present disclosure may determine a connected state of the insulation monitoring device 10 to the transmission line 170 or the ground, based on a change in the reception signal voltage Um. More specifically, the control unit 100 may detect whether or not the detected reception signal voltage Um experiences a change caused by a parasitic capacitor formed between the transmission line 170 and the ground, that is, a change caused by the system capacitor 150.

For example, as described above, the system capacitor 150 is formed between the ground and the transmission line 170. In this case, before the voltage Up of the measurement signal, which is applied to the ground, is applied to the transmission line 170, the system capacitor 150 may be first charged with this voltage Up of the measurement signal. Accordingly, the following phenomenon occurs to the system capacitor 150: while the system capacitor 150 is charged for a predetermined time, the reception signal voltage Um increases greatly, and, as the system capacitor 150 which is charged with the voltage is subsequently discharged, the reception signal voltage Um decreases gradually. This phenomenon may be repeated according to a pulse in the shape of a square wave. That is, a transient voltage that causes a magnitude of the reception signal voltage Um to increase greatly for a predetermined time may occur reiteratively according to the pulse in the shape of a square wave.

In this phenomenon, the reception signal voltage Um is abruptly raised by the system capacitor 150 and, after a predetermined time elapses, is stabilized. Consequently, in order to prevent erroneous computation, due to the transient voltage, of the insulation resistance 140, the insulation resistance computation unit 108 may detect a normal-state voltage, that is, the reception signal voltage Um in a stabilized state where a voltage change caused by the transient voltage does not occur.

To this end, when detecting the transient voltage from the reception signal voltage Um, the insulation resistance computation unit 108 may postpone computation of the insulation resistance during a sampling section that is determined according to a preset multiple of time. The insulation resistance computation unit 108 may determine whether or not the reception signal voltage Um is stabilized, depending on a difference between average voltages respectively computed during sampling sections. More specifically, the insulation resistance computation unit 108 is configured to detect an average voltage, computed during a current sampling section, as the normal-state voltage. This detection occurs in a case where a difference between the average voltage computed during the current sampling section and an average voltage computed during the preceding sampling section is equal to or smaller than a preset error.

The transient voltage, as described above, may occur while the system capacitor 150 is charged with the voltage Up of the measurement signal. That is, the transient voltage may occur in a case where the system capacitor 150 is formed between the transmission line 170 and the ground. Typically, the charging of a capacitor occurs between two conductors, which form a capacitor, in a circuit through which current flows, that is, in a closed circuit. Consequently, the transient voltage may occur only in a case where a closed insulation circuit is formed by connecting the transmission line 170 and the ground to each other through the insulation resistance 140.

Therefore, the control unit 100 may determine, through the transient voltage, whether or not the insulation monitoring device 10 is in a state of being connected to the transmission line 170 or the ground. To this end, the control unit 100 may detect a change in the reception signal voltage Um that is detected in the signal detection unit 130 and may detect whether or not the transient voltage occurs for a preset time.

In a case where the transient voltage occurs, the control unit 100 may determine that the insulation monitoring device 10 is in the state of being connected to the transmission line 170 or the ground. In a case where the transient voltage does not occur, the control unit 100 may determine that a connection is disrupted between the transmission line 170 and the insulation monitoring device 10 or between the ground and the insulation monitoring device 10.

In a case where the connection is disrupted, the control unit 100 may transmit alerting information for alerting that the connected state of the insulation monitoring device 10 is abnormal, to the preset server or a terminal used by a manager through the communication unit 106.

FIG. 1 illustrates an example where the transmission line 170 in the electric power system is configured for single-phase current. However, the transmission line 170 may, of course, also be configured for multi-phase current. As an example, the transmission line 170 may be configured for three-phase (R-S-T-line) current. In this case, the coupler resistor 180 may be configured with resistors that are formed on transmission lines, respectively, for multi-phase current. For example, in the case of three-phase current, the coupler resistor 180 may be configured with three resistors on R, S, and T lines, respectively.

A process in which the insulation monitoring device 10 according to the first embodiment of the present disclosure, which is described with reference to FIG. 1, operates to check, based on the reception signal voltage Um, whether or not the connection to the transmission line 170 or to the ground is disrupted will be described below with reference to FIGS. 2A and 2B.

Figure 2A:
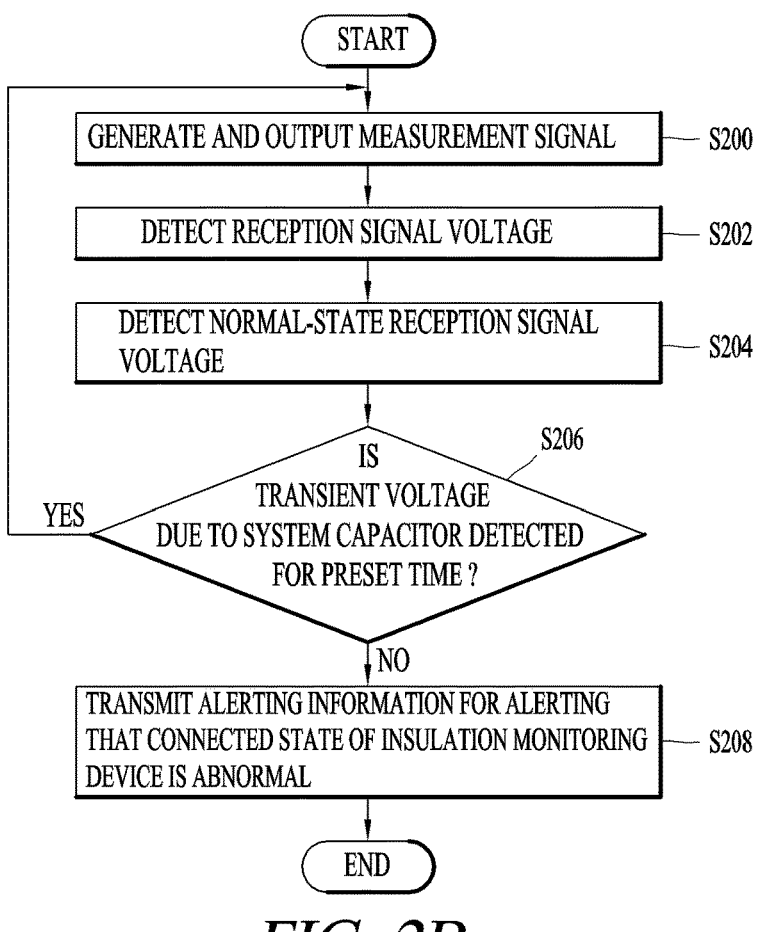
FIG. 2a is a flowchart illustrating a process in which the insulation monitoring device according to the first embodiment of the present disclosure operates to check a state of a connection to a transmission line or the ground.

FIG. 2A is a flowchart illustrating a process in which the insulation monitoring device 10 according to the first embodiment of the present disclosure operates to check a state of the connection to the transmission line 170 or the ground. FIG. 2B is a graph showing an example of a change in the reception signal voltage Um that is detected in the insulation monitoring device 10 according to the first embodiment of the present disclosure.

First, with reference to FIG. 2A, under the control of the control unit 100 of the insulation monitoring device 10 according to the first embodiment of the present disclosure, the signal generation unit 110 may generate a measurement signal with a preset positive or negative voltage. The signal generation unit 110 may output the generated measurement signal. The measurement signal, output from the signal generation unit 110, may be applied to the earthed ground through the protective earth 120 (S200).

When, in Step S200, the measurement signal is applied to the ground, the control unit 100 may detect a voltage that is detected from the insulation circuit formed to include the insulation resistance 140 and the transmission line 170 that are connected through the ground. That is, the control unit 100 may detect the reception signal voltage Um that is received from the insulation circuit in a manner that corresponds to the measurement signal (S202).

As described above, in a case where the insulation monitoring device 10 is correctly connected to the transmission line 170 and the ground, the system capacitor 150, which is formed by a system capacitance between the transmission line 170 and the ground, may be formed. Therefore, the transient voltage due to the discharging and discharging of the system capacitor 150 may occur. The control unit 100 may detect the normal-state voltage from the reception signal voltage Um that is detected after the system capacitor 150 charged with the voltage is fully discharged (S204).

To this end, the control unit 100 may determine a sampling section according to a time constant that is preset in Step S204 and may compute an average of the reception signal voltages Um during the determined sampling section. Then, the control unit 100 may newly determine a sampling section and may compute an average of the reception signal voltages Um during the newly determined sampling section. A difference between an average of the reception signal voltages Um, computed during a sampling section that immediately precedes the newly determined sampling section, and the average of the reception signal voltages Um, computed during the newly determined sampling section, may be equal to or smaller than a preset error. In this case, the control unit 100 may determine the average of the reception signal voltages Um, computed during the newly determined sampling section, as the normal-state voltage.

However, the difference between the averages of the reception signal voltages Um may exceed the preset error. In this case, the control unit 100 may reperform the following steps: newly determining a sampling section and computing an average of voltages during the newly determined sampling section; and computing an average of the reception signal voltages Um, computed during a sampling section immediately preceding the newly determined sampling section and an average of the reception signal voltages Um, computed during the newly determined sampling section. Therefore, Step S204 may be reiteratively performed until a difference between an average of the reception signal voltages Um during a currently set sampling section and an average of the reception signal voltages Um during a sampling section immediately preceding the currently set sampling section is equal to or smaller than the preset error.

When the normal-state voltage is detected in Step S204, the control unit 100 may check, for a preset time, whether or not the transient voltage, caused by charging of the system capacitor 150, is detected (S206).

In this case, in a case where the normal-state voltage is detected, the control unit 100 may set the preset time. That is, in the case where the normal-state voltage is detected, the control unit 100 may count the time that elapses after the normal-state voltage is detected. The control unit 100 may check whether or not the transient voltage is detected within the preset time. In a case where the transient voltage occurs within the preset time, the control unit 100 may initialize the counted time.

Figure 2B:
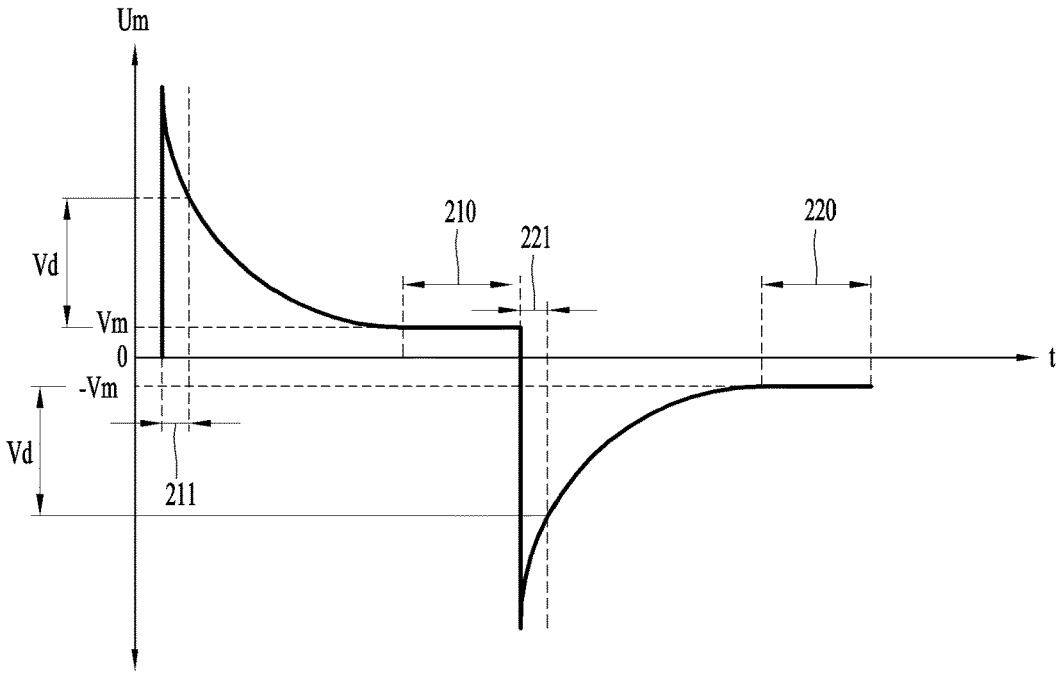
FIG. 2b is a graph showing an example of a change in a reception signal voltage that is detected in the insulation monitoring device according to the first embodiment of the present disclosure.

FIG. 2B is a graph illustrating an example of the reception signal voltage Um that causes the transient voltage in a case where the signal generation unit 110 generates a measurement signal with a preset positive voltage for a predetermined time and, when the preset time elapses, generates a measurement signal with a preset negative voltage for another predetermined time.

As illustrated in FIG. 2b, the normal-state voltage refers to a voltage (a voltage for a section 210 or 220) that results after the system capacitor 150 charged with the voltage is fully discharged and may have a predetermined positive or negative voltage (+Vm or −Vm). In contrast, the transient voltage, as a voltage greater than the normal-state voltage, may refer to a voltage during section 211 or 212 that is higher by a preset magnitude (Vd) or greater in value than the normal-state voltage (+Vm or −Vm) (a voltage during section 210 or 220).

Therefore, in Step S206, the control unit 100 may check whether or not, in a case where the normal-state voltage is detected, a voltage that is higher, by the preset magnitude (for example, Vd) or greater, than the normal-state voltage detected for a preset time in Step S204 is detected. In a case where a voltage that is higher, by the preset magnitude (for example, Vd) or greater, than the normal-state voltage (+Vm or −Vm) is detected within the preset time, the control unit 100 may determine that the reception signal voltage Um contains the transient voltage. The control unit 100 may determine that the insulation monitoring device 10 is correctly connected to the transmission line 170 and the ground and thus that the closed insulation circuit is formed. Then, the control unit 100 may proceed to Step S200 and may reperform Steps S200 to S206.

The transient voltage may occur when the voltage Up of the measurement signal changes, for example, when a voltage changes due to the pulse in the shape of a square wave, or when, as illustrated in FIG. 2b, the polarity of the measurement signal changes. Therefore, the preset time may be determined to be a time for which the voltage Up of the measurement signal changes one time. That is, the preset time may be determined to be a time corresponding to one period, in the case of a signal in the shape of a square wave that is generated only as a signal with a positive or negative voltage. Additionally, the preset time may be determined to be a time longer than a time (that is, half a period) at which positive and negative voltages alternate, in the case of a signal in the shape of a square wave that has positive and negative voltages alternating at predetermined time intervals.

That is, the preset time may be determined according to a shape of the measurement signal generated in the signal generation unit 110 and to a pulse period.

In contrast, in a case where the result of the checking in Step S206 is that a voltage that is higher, by the preset magnitude or greater, than the normal-state voltage is not detected for the preset time, the control unit 100 may determine that at least one of the connections between the transmission line 170 and the insulation monitoring device 10 and between the ground and the insulation monitoring device 10 is in a disrupted state. Therefore, by controlling the communication unit 106, the control unit 100 may transmit the alerting information for alerting that the connected state of the insulation monitoring device 10 is abnormal, to the preset server and terminal (S208).

The above-described steps in FIG. 2A may be performed with a period of the preset time. In this case, the preset time, as described above, may be determined according to the shape of the measurement signal generated in the signal generation unit 110 and to the pulse period. For example, the preset time may refer to a time corresponding to one period of the measurement signal. In this case, the control unit 100 may detect the transient voltage from the reception signal voltage U$_m$ by reiterating the steps in FIG. 2A each time one period of the measurement signal is completed. Then, the control unit 100 may transmit the alerting information for alerting that the connected state of the insulation monitoring device 10 is abnormal, based on the result of detecting the transient voltage.

FIG. 2B assumes a case where the signal generation unit 110 generates the measurement signal with a preset positive and the measurement signal with a negative voltage that alternate at predetermined time intervals. However, the signal generation unit 110 may also generate, as the measurement signal, a signal in the shape of a square wave with only a positive voltage or may also generate, as the measurement signal, a signal in the shape of a square wave with only a negative voltage. In this case, the signal detection unit 130 may successively detect only sections having a positive voltage instead of sections having a negative voltage (in a case where the signal in the shape of a square wave with a positive voltage is applied as the measurement signal), or may successively detect only sections having a negative voltage instead of sections having a positive voltage (in a case where the signal in the shape of a square wave with a negative voltage is applied as the measurement signal).

A process of detecting the normal-state reception signal voltage U$_m$ in Step S204 may be part of the process in which the insulation resistance computation unit 108 computes the insulation resistance 140.

As described above, in a case where the transient voltage occurs, in order to prevent erroneous computation of the insulation resistance 140 due to the transient voltage, the insulation resistance computation unit 108 may compute the insulation resistance 140 from the stabilized reception signal voltage U$_m$, that is, from the normal-state reception signal voltage U$_m$. Accordingly, the control unit 100 may postpone the computation of the insulation resistance 140 until the normal-state reception signal voltage U$_m$ is detected.

In this case, a process of computing the normal-state voltage in order to compute the insulation resistance 140 may correspond to Step S204. Therefore, when the normal-state voltage is detected in Step S204, based on the detected normal-state voltage, the control unit 100 may control the insulation resistance computation unit 108 in such a manner as to compute the insulation resistance 140. At the same time, by proceeding to Step S206, the control unit 100 may detect whether or not the transient voltage caused by the system capacitor 150 occurs.

As an example, the normal-state voltage is described above as being detected based on the reception signal voltage U$_m$. However, the normal-state voltage for detecting the transient voltage may be, of course, prestored in the memory 104. In this case, Step S204 may refer to a step of reading the normal-state voltage stored in the memory 104. In this case, the normal-state voltage stored in the memory 104 may be different from the normal-state voltage that is detected by the insulation resistance computation unit 108 in order to compute the insulation resistance 140.

Figure 3:
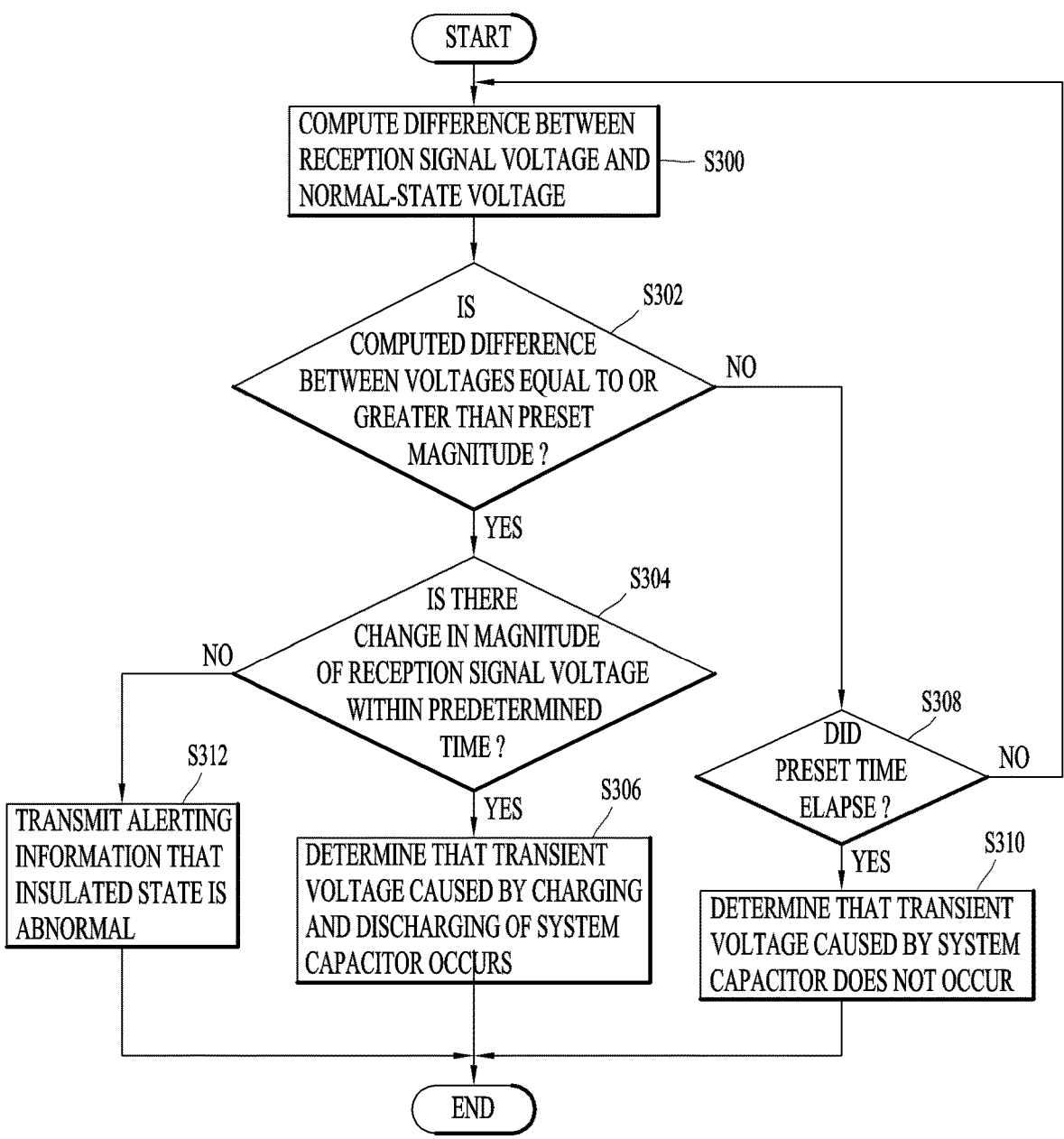
FIG. 3 is a flowchart illustrating in more detail a process in which the insulation monitoring device according to the first embodiment of the present disclosure operates to determine whether or not a transient voltage is contained in the reception signal voltage.

FIG. 3 is a flowchart illustrating in more detail Step S206 in FIG. 2 in which the insulation monitoring device 10 according to the first embodiment of the present disclosure operates to determine from the reception signal voltage U$_m$ whether or not the transient voltage is contained in the reception signal voltage U$_m$.

With reference to FIG. 3, in order to detect whether or not the detected reception signal voltage U$_m$ contains the transient voltage, the control unit 100 of the insulation monitoring device 10 according to the first embodiment of the present disclosure may compute a difference between a currently detected reception signal voltage U$_m$ and the normal-state voltage detected in Step S204 (S300). Then, the control unit 100 may determine whether or not the computed difference between the voltages is at or above a voltage value (for example, Vd) of preset magnitude (S302).

When the result of the determination in Step S302 is that the computed difference between the voltages is below the voltage value of preset magnitude, the control unit 100 may check whether or not the preset time elapses (S308). When the preset time does not elapse, the control unit 100 may compute a difference between the currently detected reception signal voltage U$_m$ and the normal-state voltage by preceding to Step S300. Then, the control unit 100 may compare the computed difference between the voltages with the voltage value of preset magnitude by proceeding to Step S302.

Then, the control unit 100 may determine whether or not the preset time elapses by proceeding back to Step S308 according to the result of the determination in Step S302. When the result of the checking in Step S308 is that the preset time elapses, the control unit 100 may determine that the transient voltage caused by the charging and discharging of the system capacitor 150 does not occur. Then, the control unit 100 may transmit the alerting information for alerting that the connected state of the insulation monitoring device 10 is abnormal, by proceeding from Step S206 in FIG. 2 to Step S208 in FIG. 2.

In a case where dielectric breakdown occurs due to grounding or the like, the insulation resistance 140 decreases, and thus the reception signal voltage $U_m$ may have a high value. In this case, it may be determined that the transient voltage caused by the reception signal voltage $U_m$ occurs.

In order to prevent this phenomenon, in a case where the computed difference between the voltages is higher, by a preset magnitude or greater, the normal-state voltage, the control unit 100 may check whether or not the reception signal voltage $U_m$ substantially changes. Then, the control unit 100 may determine whether or not the transient voltage occurs, depending on whether or not the reception signal voltage $U_m$ changes. The reason for this determination is that, in a case where the reception signal voltage $U_m$ is not stabilized, that is, in a case where the system capacitor 150 is not fully discharged, as illustrated in FIG. 2_b_, the more discharged the system capacitor 150, the lower value the reception signal voltage $U_m$ has. Therefore, when the result of the determination in Step S302 is that the computed difference between the voltages is equal to or greater than a preset magnitude, the control unit 100 may check whether or not there is a change in the magnitude of the reception signal voltage $U_m$ detected within a predetermined time (S304).

When the result of the checking in Step S304 is that the magnitude of the reception signal voltage $U_m$ changes by a predetermined magnitude or greater for the predetermined time, the control unit 100 may determine that the transient voltage occurs (S306). The predetermined magnitude is used in checking whether or not the reception signal voltage $U_m$ substantially changes. Therefore, even though the reception signal voltage $U_m$ changes, but not by the predetermined magnitude or greater, the control unit 100 may regard this change in the reception signal voltage $U_m$ as being caused by noise or the like and may ignore such a change.

When it is determined, as a result of the checking in Step S306, that the transient voltage occurs, the control unit 100 may reiterate Steps S200 to S206 by proceeding from Step S206 in FIG. 2 back to Step S200 in FIG. 2.

In a case where the result of the checking in Step S304 is that the magnitude of the reception signal voltage $U_m$ does not change by the predetermined magnitude or greater for the predetermined time, that is, in a case where the reception signal voltage $U_m$ that is higher, by the predetermined magnitude or greater, than the normal-state voltage is continuously detected, the control unit 100 may determine that grounding due to dielectric breakdown between the transmission line 170 and the ground occurs. Then, by controlling the communication unit 106, the control unit 100 may transmit the alerting information to the preset server or the terminal used by the manager (S312). In this case, the alerting information transmitted in Step S312 may include information for alerting that an insulated state of the insulation monitoring device 10 is abnormal.

An insulation monitoring device 40 according to a second embodiment of the present disclosure employs a different configuration than the insulation monitoring device 10 according to the first embodiment of the present disclosure, which is described above with reference to FIG. 1. The insulation monitoring device 40 according to the second embodiment may include the protective earth 120, the signal generation unit 110, the signal detection unit 130, and a switch (hereinafter referred to as a circuit opening and closing switch) that is capable of opening and closing the insulation circuit that is formed by connecting the coupler resistor 180, the transmission line 170, the insulation resistance 140, and the ground. When the insulation monitoring device 40 is installed, or when the insulation monitoring device 40 is reset, a state of a connection between the insulation monitoring device 40 and the transmission line 170 and a state of a connection between the insulation monitoring device 40 and the ground may be, of course, checked in conjunction with switched-on and -off states of the circuit opening and closing switch 410.

Figure 4:
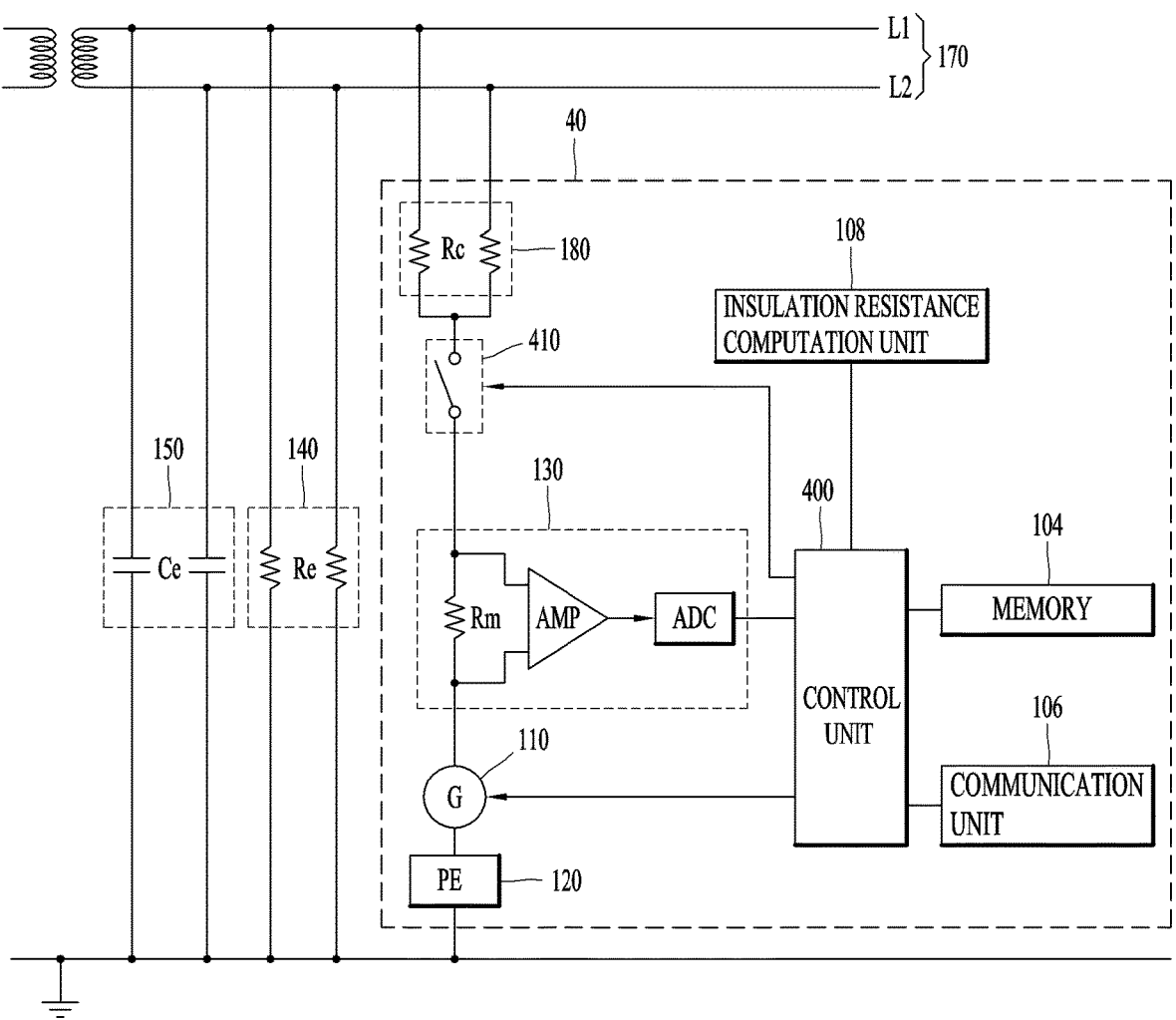
FIG. 4 is a block diagram illustrating a configuration of an insulation monitoring device according to a second embodiment of the present disclosure that includes the transmission line, an insulation resistance, and a circuit opening and closing switch that controls opening and closing of a circuit that is connected to the ground.
Figure 5:
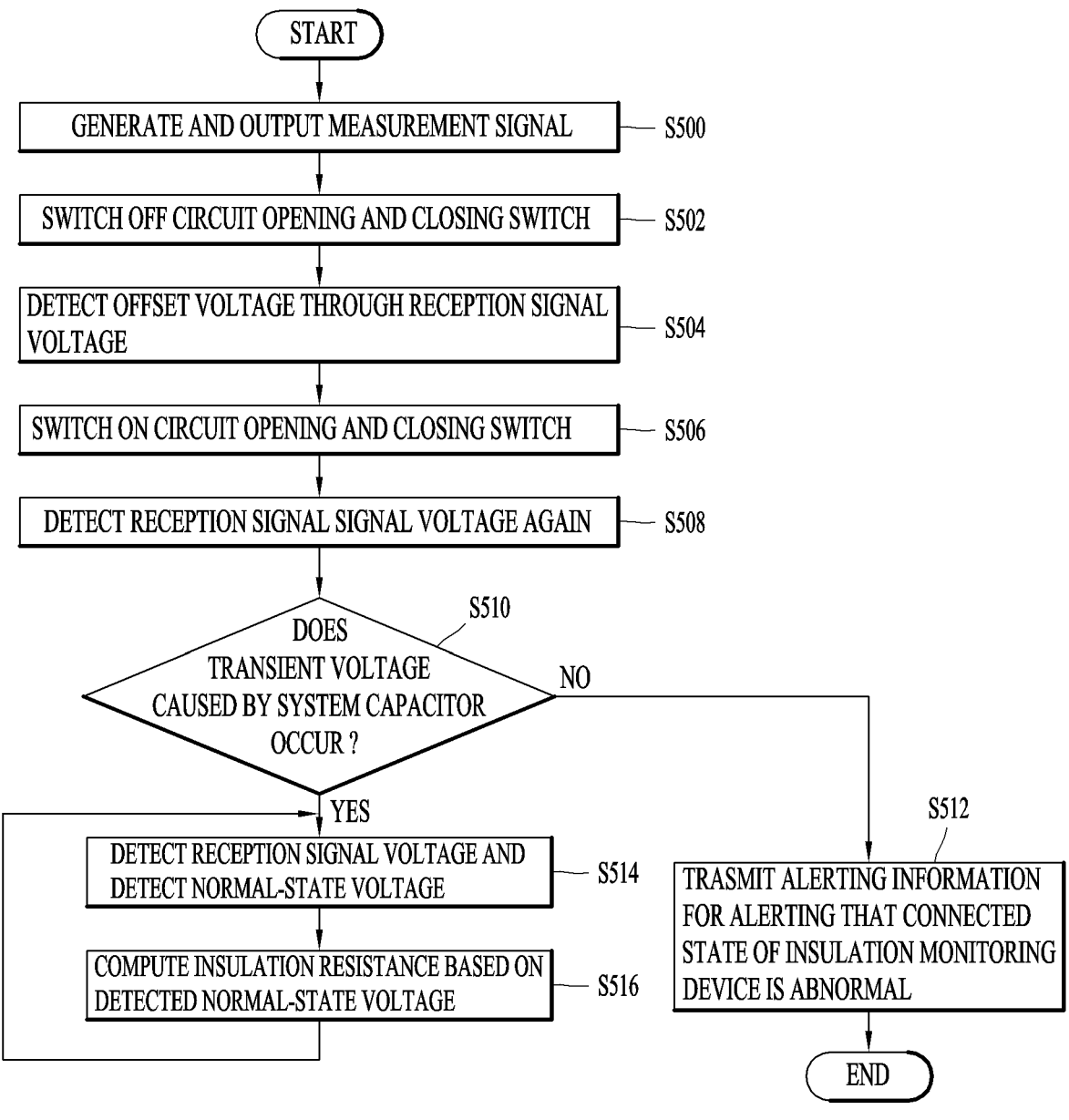
FIG. 5 is a flowchart illustrating a process in which the insulation monitoring device illustrated in FIG. 4 operates to check a state of a connection between the insulation monitoring device and the transmission line and a state of a connection between the insulation monitoring device and the ground and to compute the resistance of the insulation resistance, based on switched-on and -off states of the circuit opening and closing switch.

FIG. 4 is a block diagram illustrating a configuration of the insulation monitoring device 40 according to the second embodiment of the present disclosure that includes the transmission line 170, the insulation resistance 140, and the circuit opening and closing switch 410 that controls the opening and closing of the insulation circuit that is connected to the ground. FIG. 5 is a flowchart illustrating a process in which the insulation monitoring device 40 illustrated in FIG. 4 operates to check the state of the connection between the insulation monitoring device 40 and the transmission line 170 and the state of the connection between the insulation monitoring device 40 and the ground, based on the switched-on and -off states of the circuit opening and closing switch 410 and then to compute the insulation resistance 140.

With reference to FIG. 4, the circuit opening and closing switch 410 is first described as being arranged, within the insulation monitoring device 40, on the insulation circuit that is formed by connecting the transmission line 170, the insulation resistance 140, and the ground. It is more preferred that the circuit opening and closing switch 410 may be arranged between the coupler resistor 180 and the detection resistor Rm. The circuit opening and closing switch 410 may be switched on or off under the control of a control unit 400.

The switched-on state of the circuit opening and closing switch 410 may refer to a state where both ends of the circuit opening and closing switch 410 are connected to each other. Therefore, in a case where the circuit opening and closing switch 410 is switched on, a connection between the coupler resistor 180 and the detection resistor Rm may be enabled. Therefore, the insulation circuit, formed by connecting the protective earth 120, the signal generation unit 110, the signal detection unit 130, and the coupler resistor 180, the transmission line 170, the insulation resistance 140, and the ground, may be closed.

In contrast, the switched-off state of the circuit opening and closing switch 410 may refer to a state where both ends of the circuit opening and closing switch 410 are not connected to each other. Therefore, in a case where the circuit opening and closing switch 410 is switched off, the electrical connection between the coupler resistor 180 and the detection resistor Rm may be disabled. Therefore, the insulation circuit, formed by connecting the protective earth 120, the signal generation unit 110, the signal detection unit 130, the coupler resistor 180, the transmission line 170, the insulation resistance 140, and the ground, may be open. In this case, the insulation monitoring device 10 may be separated from the electric power system.

In a case where the insulation monitoring device 40 satisfies a preset condition, the control unit 400 may switch on or off the circuit opening and closing switch 410. As an example, in a state where the insulation monitoring device 40 is powered off, when the insulation monitoring device 40 is powered on again or when the insulation monitoring device 40 is reset, the control unit 400 may switch off the circuit opening and closing switch 410.

FIG. 5 illustrates a process in which, in a case where the insulation monitoring device 40 according to the second embodiment of the present disclosure starts to be driven by being powered on again or reset, the insulation monitoring device 40 operates to check whether or not the insulation monitoring device 40 is correctly connected to the transmission line 170 and the ground, based on an operating state of the circuit opening and closing switch 410 and then to compute the insulation resistance 140.

With reference to FIG. 5, the control unit 400 of the insulation monitoring device 40 according to the second embodiment of the present disclosure, when starting to operate, may first control the signal generation unit 110 in such a manner as to generate and output the measurement signal (S500).

The reception signal voltage $U_m$ that is detected may be computed according to Mathematical Equation 1 that follows, taking into consideration voltages of both ends of the circuit opening and closing switch 410.

$$U_m = V_{offset} - A_v \times U_p \times \frac{R_m}{R_m + R_c + R_e + R_s}$$ [Mathematical Equation 1]

where $U_m$ depicts a reception signal voltage, $V_{offset}$ depicts an offset voltage, $A_v$ depicts a reception gain, $U_p$ depicts a measurement signal voltage, $R_m$ depicts resistance of a detection resistor, $R_c$ depicts resistance of a coupler resistor, $R_e$ depicts resistance of an insulation resistance, and $R_s$ depicts resistance of both ends of a circuit opening and closing switch.

While Step S500 is performed, the circuit opening and closing switch 410 may maintain its switched-on state. For example, the switched-on state of the circuit opening and closing switch 410 may be a default state. Accordingly, the circuit opening and closing switch 410, when not controlled by the control unit 400, may maintain its switched-on state.

The control unit 400 may switch off the circuit opening and closing switch 410 (S502). Then, the electrical connection between the coupler resistor 180 and the detection resistor Rm is disabled. Accordingly, the insulation circuit, formed by connecting the transmission line 170, the insulation resistance 140, and the ground may be open. That is, the insulation monitoring device 40 may be separated from the electric power system.

In this manner, in a state where the circuit opening and closing switch 410 is open, the control unit 400 may detect the reception signal voltage $U_m$ through the signal detection unit 130 (S504). In this case, when both ends of the circuit opening and closing switch 410 are not connected to each other, resistance Rs of both ends of the circuit opening and closing switch 410 may be close to infinity. Therefore, if the reception signal voltage $U_m$ is computed based on Mathematical Equation 1, when the circuit opening and closing switch 410 is switched off, regarding the reception signal voltage $U_m$, only $V_{offset}$ may be computed as expressed in Mathematical Equation 2 that follows.

The offset voltage here may be a preset voltage that is applied to the signal detection unit 130, as a voltage that is applied by a circuit itself in order to compensate for an output that may occur even though an input signal is 0.

$$U_m = V_{offset} \text{[if switch is off]}$$ [Mathematical Equation 2]

In a state where the circuit opening and closing switch 410 is switched off, when the reception signal voltage $U_m$ is detected, the control unit 400 may again switch on the circuit opening and closing switch 410 (S506). Then, in a state where the circuit opening and closing switch 410 is switched on, the reception signal voltage $U_m$ may be detected again (S508).

In a case where the circuit opening and closing switch 410 is switched on, the connection between the coupler resistor 180 and the detection resistor Rm may be enabled. Therefore, the insulation circuit, formed by connecting the transmission line 170, the insulation resistance 140, and the ground, may be closed again. In this case, the resistance of both ends of the circuit opening and closing switch 410 may be close to 0. Therefore, in a case where the circuit opening and closing switch 410 is switched on, the reception signal voltage $U_m$ may be computed according to Mathematical Equation 3 that follows.

$$U_m = V_{offset} - A_v \times U_p \times \frac{R_m}{R_m + R_c + R_e} \text{[if switch is on]}$$ [Mathematical Equation 3]

In a state where the circuit opening and closing switch 410 is switched on, when the reception signal voltage $U_m$ is detected, the control unit 400 may detect whether or not a change in the detected reception signal voltage $U_m$ is due to the transient voltage caused by the charging and discharging of the system capacitor 150 (S510).

Step S510 may refer to a step in which the transient voltage is detected from the reception signal voltage $U_m$ detected according to the process that is described with reference to FIG. 3. In this process in FIG. 3, in a case where the voltage that is higher, by a preset magnitude or greater, than the normal-state voltage is detected, the reception signal voltage $U_m$ is determined to contain the transient voltage, based on the normal-state voltage. In Step S510, the control unit 400 may regard, as normal-state voltage, the reception signal voltage $U_m$ computed in Step S504, that is, the offset voltage $V_{offset}$ detected in a state where the circuit opening and closing switch 410 is switched off. Then, based on the offset voltage, the control unit 400 may detect the presence or absence of the transient voltage.

In this case, when the insulation monitoring device 40 is correctly connected to the transmission line 170 and the ground, as illustrated in FIG. 2*b*, the reception signal voltage $U_m$ may greatly increase (the transient voltage may occur) for a predetermined time (during section 211 or 221) due to the system capacitance present between the transmission line 170 and the ground. Then, the reception signal voltage $U_m$ gradually decreases with the passage of time. Even in a case where the system capacitor 150 is fully discharged, as shown during the voltage-stabilized time section 210 or 220 in FIG. 2*b*, a voltage in the form of approximately direct current (DC) may be detected.

Therefore, according to a change in the magnitude of the reception signal voltage $U_m$, the control unit 400 may detect that the transient voltage is present and may determine that the insulation monitoring device 40 is correctly connected to the transmission line 170 and the ground.

When it is determined in this manner that the insulation monitoring device 40 is correctly connected to the transmission line 170 and the ground, the control unit 400 may detect the reception signal voltage $U_m$ and may detect the normal-state voltage from the detected reception signal voltage $U_m$ (S514). Then, the control unit 400 may compute the insulation resistance 140 based on the detected normal-state voltage (S516). Then, the control unit 400 may reiteratively perform Steps S514 and S516 and thus may continuously monitor an insulated state of the transmission line 170.

In contrast, in a state where the insulation monitoring device 40 is not correctly connected to the transmission line 170 and the ground (for example, a state where the connection of the insulation monitoring device 40 is disrupted or a state where the insulation monitoring device 40 is separated from the electric power system), the system capacitor 150 is not formed due to the system capacitance present between the transmission line 170 and the ground. Therefore, the charging and discharging of the system capacitor 150 do not occur. Consequently, a state where only the offset voltage$_{Voffset}$ is detected can be continuously maintained. Therefore, the transient voltage may not be detected.

Then, the control unit 400 may determine that the insulation monitoring device 40 is not correctly connected to the transmission line 170 and the ground, and, by controlling the communication unit 106, may transmit the alerting information for alerting that a connected state of the insulation monitoring device 40, to the preset server or the terminal used by the manager is abnormal.

The example where, in a case where the insulation monitoring device 40 is driven by being powered on again or reset, the circuit opening and closing switch 410 is switched off and then on again is described above. However, in a case where the manager's request is received, the circuit opening and closing switch 410 may, of course, be switched off and on.

In this case, the insulation monitoring device 40 is in a continuously driven state. Consequently, the signal generation unit 110 may be in a state of generating and applying the measurement signal. Therefore, while the insulation monitoring device 40 operates, in a case where the circuit opening and closing switch 410 is switched off and on according to the manager's request, the control of the signal generation unit 110 may also be omitted from Step S500 in FIG. 5.

The example where one circuit opening and closing switch 410 is provided between the coupler resistor 180, made up of the resistors respectively connected to the transmission lines L1 and L2, and the detection resistor Rm is described above with reference to FIG. 4. However, the circuit opening and closing switches may, of course, be provided to the transmission lines L1 and L2, respectively.

Figure 6:
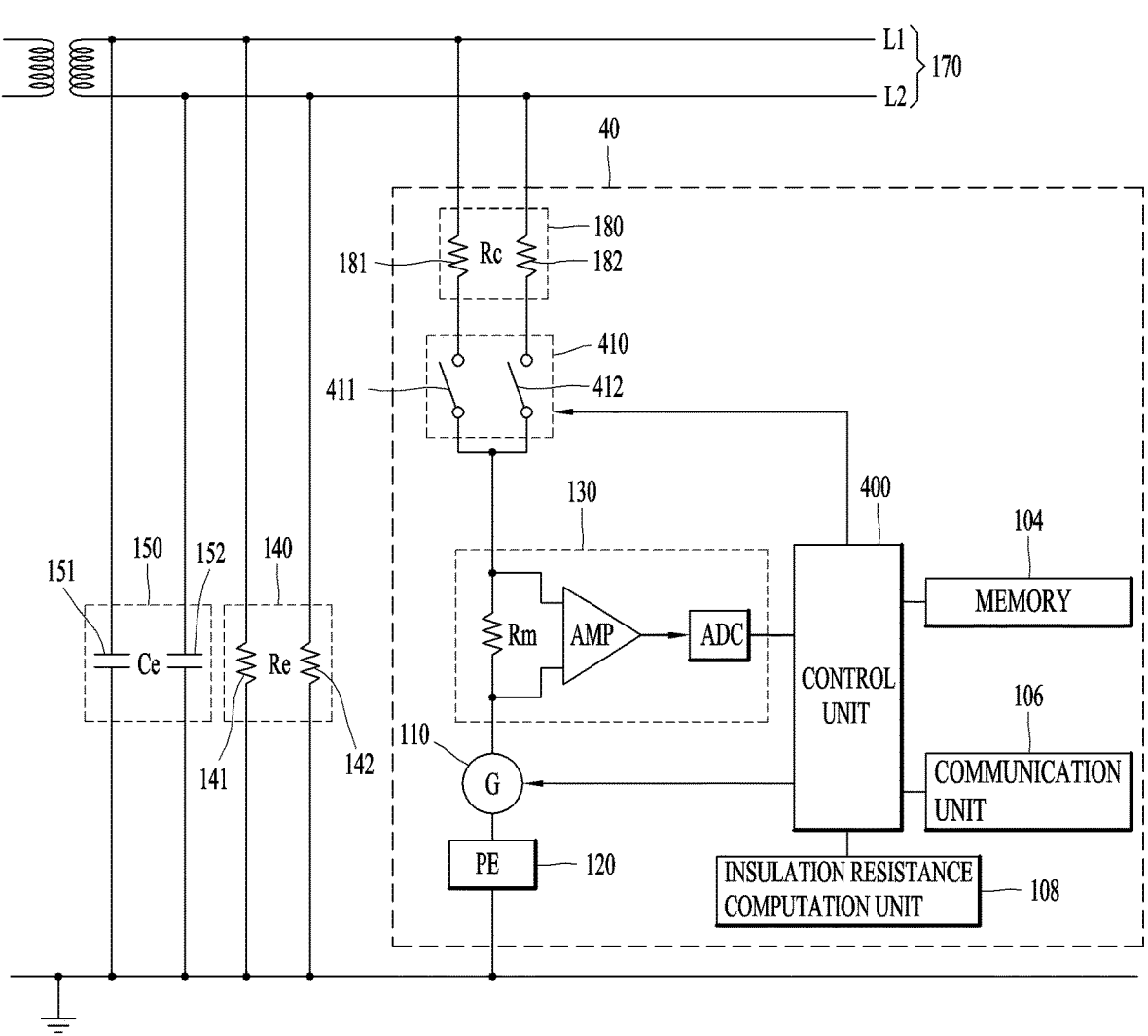
FIG. 6 is a block diagram illustrating a structure where the insulation monitoring device according to the second embodiment of the present disclosure is connected to a plurality of transmission lines through a plurality of circuit opening and closing switches, respectively.

FIG. 6 is a block diagram illustrating a structure where the insulation monitoring device 40 according to the second embodiment of the present disclosure is connected to a plurality of transmission lines through a plurality of circuit opening and closing switches, respectively.

With reference to FIG. 6, a first coupler resistor 181, which is connected to a first transmission line L1, may be serially connected to a first switch 411 among a plurality of switches that constitute the circuit opening and closing switch 410. In addition, a second coupler resistor 182, which is connected to a second transmission line L2, may be serially connected to a second switch 412 among the plurality of switches that constitute the circuit opening and closing switch 410. The control unit 400 may control the first switch 411 and the second switch 412 independently of each other.

As an example, the control unit 400 may not only switch on or off both the first switch 411 and the second switch 412, but may also switch on one thereof and switch off the other one. In this case, the first switch 411 and the second switch 412 may be both switched on or off in the same manner as when the circuit opening and closing switch 410 is switched on or off as described with reference to FIGS. 4 and 5.

In addition, the control unit 400 may check the connected state of the insulation monitoring device 40 to each of the first and second transmission lines L1 and L2 by controlling each of the first and second switches 411 and 412. To this end, the control unit 400 may check the connected state of the insulation monitoring device 40 to each of the first and second switches 411 and 412 in the similar manner to that described with respect to FIG. 5.

As an example, in a state where the first switch 411 and the second switch 412 are both switched off, the control unit 400 may detect the reception signal voltage $U_m$ through the signal detection unit 130. In this case, since the first switch 411 and the second switch 412 are both switched off, the electrical connection between each of the first and second transmission lines L1 and L2 and the insulation monitoring device 40 may be disabled. Therefore, the offset voltage may be detected in the signal detection unit 130.

In this state, the control unit 400 may first switch off only the first switch 411. In this case, the second switch 412 may maintain its switched-off state. Then, a first insulation circuit may be formed by connecting the ground, a first insulation resistance 141, the first transmission line L1, the signal generation unit 110, and the protective earth 120 through the first coupler resistor 181 and the detection resistor Rm.

Then, the control unit 400 may detect the reception signal voltage $U_m$ through the signal detection unit 130 and may detect whether or not the change in the detected reception signal voltage $U_m$ is due to the transient voltage. In this case, in a similar manner to that described with reference to FIG. 5, the control unit 400 may detect the transient voltage based on the reception signal voltage $U_m$ detected in a state where the first and second switches 411 and 412 are both switched off, that is, based on the offset voltage.

As an example, the control unit 400 may detect the transient voltage, depending on whether or not a voltage that is higher, by a preset magnitude or greater, than the offset voltage is present. In a case where the transient voltage is detected, the control unit 400 may determine that the insulation monitoring device 40 is correctly connected to the first transmission line L1.

When, as a result of the checking, the connection between the insulation monitoring device 40 and the first transmission line L1 is enabled, the control unit 400 may switch off the first switch 411 and may switch on the second switch 412. Then, the first insulation circuit is open that is formed by connecting the ground, the first insulation resistance 141, the first transmission line L1, the signal generation unit 110, and the protective earth 120 through the first coupler resistor 181 and the detection resistor Rm. Additionally, a second insulation circuit may be formed by connecting the ground, a second insulation resistance 142, the second transmission line L2, the signal generation unit 110, and the protective earth 120 through the second coupler resistor 182 and the detection resistor Rm.

Then, the control unit 400 may detect the reception signal voltage $U_m$ through the signal detection unit 130 and may detect whether or not the change in the detected reception signal voltage $U_m$ is due to the transient voltage. In this case, in a similar manner to that described with reference to FIG. 5, the control unit 400 may detect the transient voltage based on the offset voltage.

As an example, the control unit 400 may detect the transient voltage, depending on whether or not the voltage that is higher, by a preset magnitude or greater, than the offset voltage is present. In the case where the transient voltage is detected, the control unit 400 may determine that the insulation monitoring device 40 is correctly connected to the second transmission line L2.

In this manner, the insulation monitoring device 40 according to the second embodiment of the present disclosure may check a state of the connection between the first transmission lines L1 and the insulation monitoring device 40 and a state of the connection between the second transmission lines L2 and the insulation monitoring device 40, based on operating states of the first switch 411 and the second switch 412, respectively. When as a result of the checking, the insulation monitoring device 40 is in a state of being correctly connected to each of the first and second transmission lines L1 and L2, the control unit 400 may switch on both the first and second switches 411 and 412. Then, the insulation resistance 140 may be computed based on the voltage detected through the signal detection unit 130, and an insulated state between the transmission line 170 and the ground may be monitored through the computed resistance of the insulation resistance 140.

In contrast, when the result of checking the state of the connection between each of the first and second transmission lines L1 and L2 and the insulation monitoring device 40 is that the connection of the insulation monitoring device 40 to at least one of the first and second transmission lines L1 and L2 is disrupted, the control unit 400 may transmit the alerting information for alerting that the connected state of the insulation monitoring device 40 is abnormal, to the preset server or the terminal used by the manager.

In this case, the alerting information may include information on the transmission line, the electrical connection of the insulation monitoring device 40 to which is disrupted. As an example, the alerting information may include information on one of the first and second transmission lines L1 and L2, the electrical connection of the insulation monitoring device 40 to which is disrupted.

An insulation monitoring device 70 according to a third embodiment of the present disclosure may be connected to an enclosure (for example, a casing or panel of a distributing board) of a load through the ground. To this end, the insulation monitoring device 70 according to the third embodiment of the present disclosure may include a terminal (hereinafter referred to as an enclosure terminal KE) that is connected to the enclosure of the load.

Figure 7:
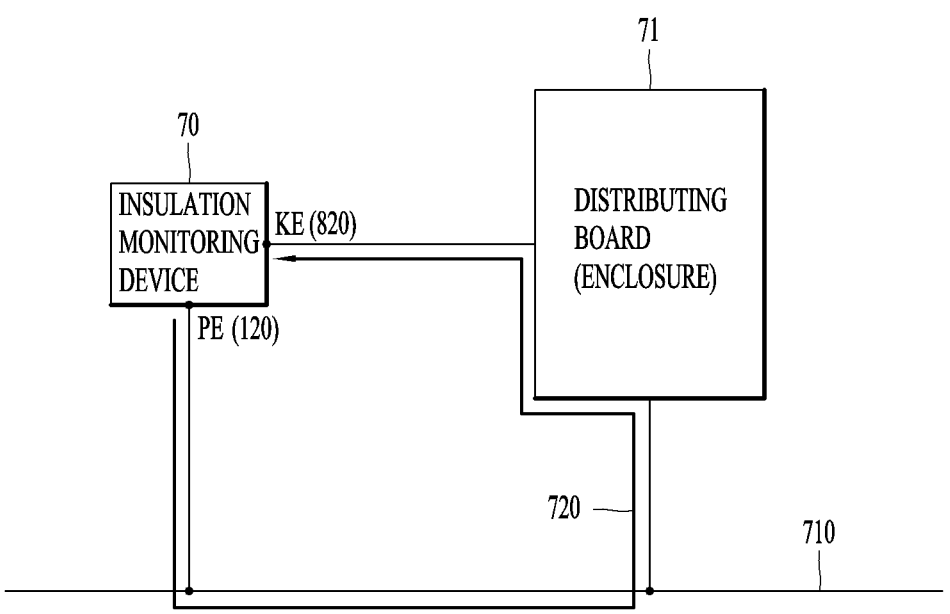
FIG. 7 is a conceptual diagram illustrating an example where an insulation monitoring device according to a third embodiment of the present disclosure is connected to an enclosure of a load.

FIG. 7 is a conceptual diagram illustrating an example where the insulation monitoring device 70 according to the third embodiment of the present disclosure is connected to an enclosure 71 of the load.

With reference to FIG. 7, the insulation monitoring device 70 according to the third embodiment of the present disclosure may include the protective earth (PE) 120 and an enclosure terminal (KE) 820. The protective earth (PE) 120 may be grounded to the ground 710, and the enclosure terminal (KE) 820 may be connected to the enclosure 71 of the load, that is, to the enclosure 71 of the distributing board. The enclosure 71 of the distributing board may be grounded to the ground 710.

Therefore, as illustrated in FIG. 7, the protective earth (PE) 120 and the enclosure of the enclosure 71 may be connected to each other through the ground 710. The enclosure 71 of the distributing board may be connected to the insulation monitoring device 70 through the enclosure terminal (KE) 820. Consequently, as illustrated in FIG. 7, a circuit (hereinafter referred to as an enclosure grounding circuit 720) may be formed by connecting the ground 710, the protective earth (PE) 120, the enclosure terminal (KE) 820 and the distributing board 71, and by connecting the distributing board 71 back to the ground 710. Therefore, in a case where the measurement signal generated in the signal generation unit 110 is applied to the ground 710 through the protective earth (PE) 120, along the enclosure grounding circuit 720, the measurement signal may be received by the insulation monitoring device 70 through the enclosure terminal (KE) 820.

The insulation monitoring device 70 according to the third embodiment of the present disclosure may check a state where the enclosure 71 of the distributing board and the insulation monitoring device 70 are connected to each other, and a grounded state of the enclosure 71 of the distributing board, using the enclosure grounding circuit 720 formed as illustrated in FIG. 7.

Figure 8:
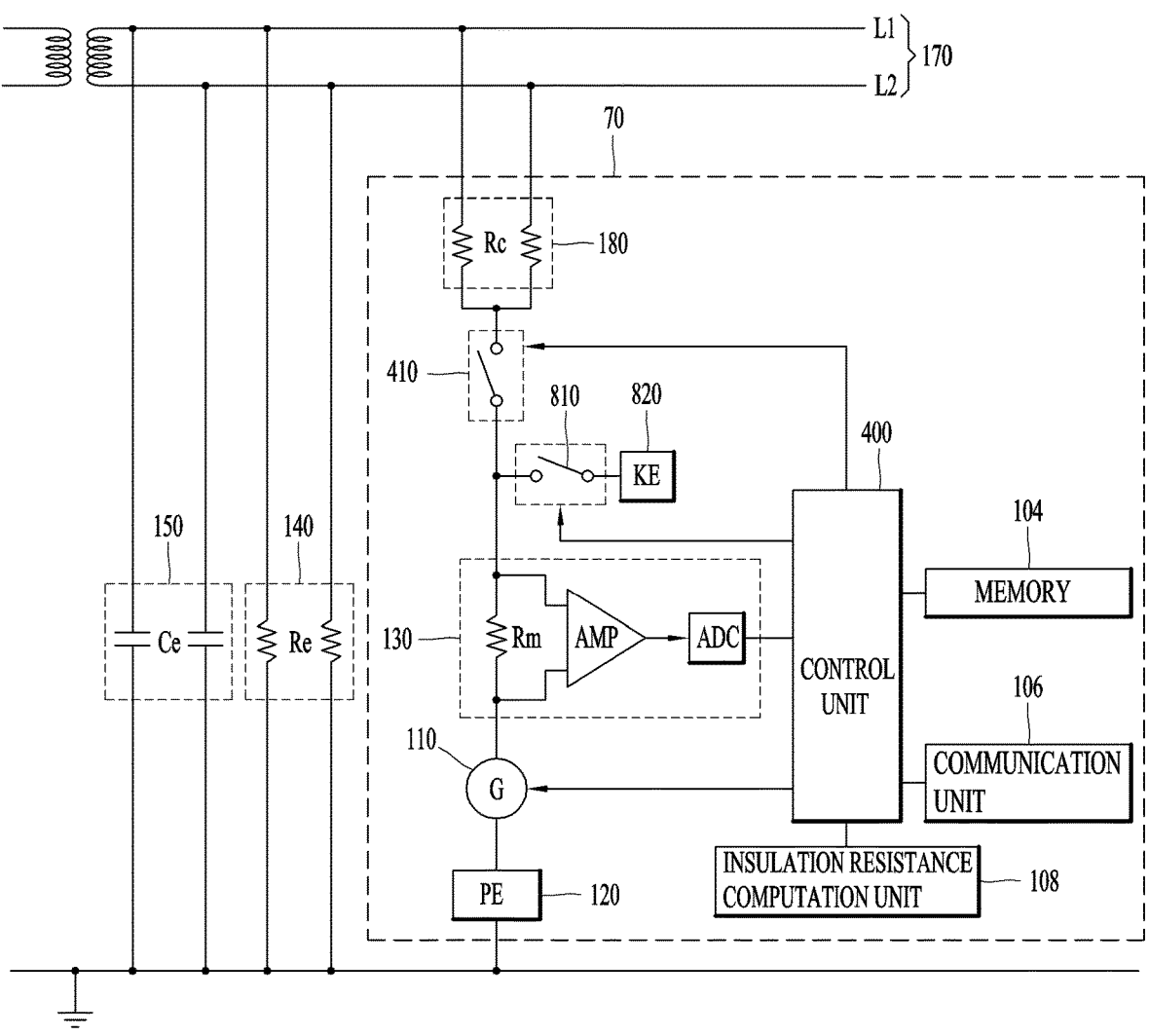
FIG. 8 is a block diagram illustrating a configuration of the insulation monitoring device according to the third embodiment of the present disclosure that is capable of checking a connected state of the insulation monitoring device to the enclosure of the load and a grounded state of the enclosure of the load, using an enclosure grounding circuit connected through an enclosure terminal (KE).

FIG. 8 is a block diagram illustrating a configuration of the insulation monitoring device 70 according to the third embodiment of the present disclosure that is capable of checking the connected state of the insulation monitoring device 70 to the enclosure 71 of the load and the grounded state of the enclosure 71 of the load, using the enclosure grounding circuit 720 connected through the enclosure terminal (KE) 820.

With reference to FIG. 8, the insulation monitoring device 70 according to the third embodiment of the present disclosure may include the enclosure terminal (KE) 820. The enclosure terminal (KE) 820 may be connected to an enclosure grounding switch 810 that is connected to the insulation resistance Rm, and the enclosure grounding switch 810 may be switched on and off under the control of the control unit 400.

Accordingly, when the enclosure grounding switch 810 is switched on, both ends of the enclosure grounding switch 810 may be connected to each other. Therefore, the detection resistor Rm and the enclosure terminal (KE) 820 may be connected to each other and may be connected to the enclosure grounding circuit 720 through the enclosure terminal (KE) 820. That is, a closed enclosure circuit may be formed by connecting the signal generation unit 110, the enclosure grounding circuit 720 (formed by connecting the ground 710, the protective earth 120, the enclosure terminal (KE) 820), and the enclosure 71 of the load (for example, the distributing board)), and the detection resistor Rm, with the load, for example, the enclosure 71 of the distributing board, being grounded through the ground 710. In addition, the switched-on state of the enclosure grounding switch 810 may refer to a default state.

In contrast, when the enclosure grounding switch 810 is switched off, an electrical connection between both ends of the enclosure grounding switch 810 may be disabled. Therefore, the connection between the detection resistor Rm and the enclosure terminal (KE) 820 may be disabled. Therefore, the enclosure circuit may be open.

In a case where the insulation monitoring device 70 according to the third embodiment of the present disclosure has a configuration as illustrated in FIG. 8, by controlling the enclosure grounding switch 810, the insulation monitoring device 70 may check a state of the connection between the enclosure 71 of the load and the insulation monitoring device 70, based on voltages that are detected in the signal detection unit 130 in a state where the enclosure grounding switch 810 is switched off and in a state where the enclosure grounding switch 810 is switched on.

In this case, when the transmission line 170 and the detection resistor Rm are connected to each other, a voltage that is received through the insulation circuit including the insulation resistance 140 and a voltage that is input through the enclosure terminal (KE) 820 may be synthesized. In this case, the state of the connection between the enclosure 71 of the load and the insulation monitoring device 70 may not be correctly measured. Because of this, the control unit 400 may check the state of the connection between the enclosure 71 and the insulation monitoring device 70 in a state where the connection between the transmission line 170 and the insulation monitoring device 70 is disabled.

Therefore, in a case where, in FIG. 5, the insulation circuit between the transmission line 170 and the insulation monitoring device 70 is open in order to check the connection between the transmission line 170 and the insulation monitoring device 70, that is, in a state where the circuit opening and closing switch 410 is switched off, the control unit 400 may further check the enclosure 71 of the load and the insulation monitoring device 70 by controlling the enclosure grounding switch 810.

Figure 9:
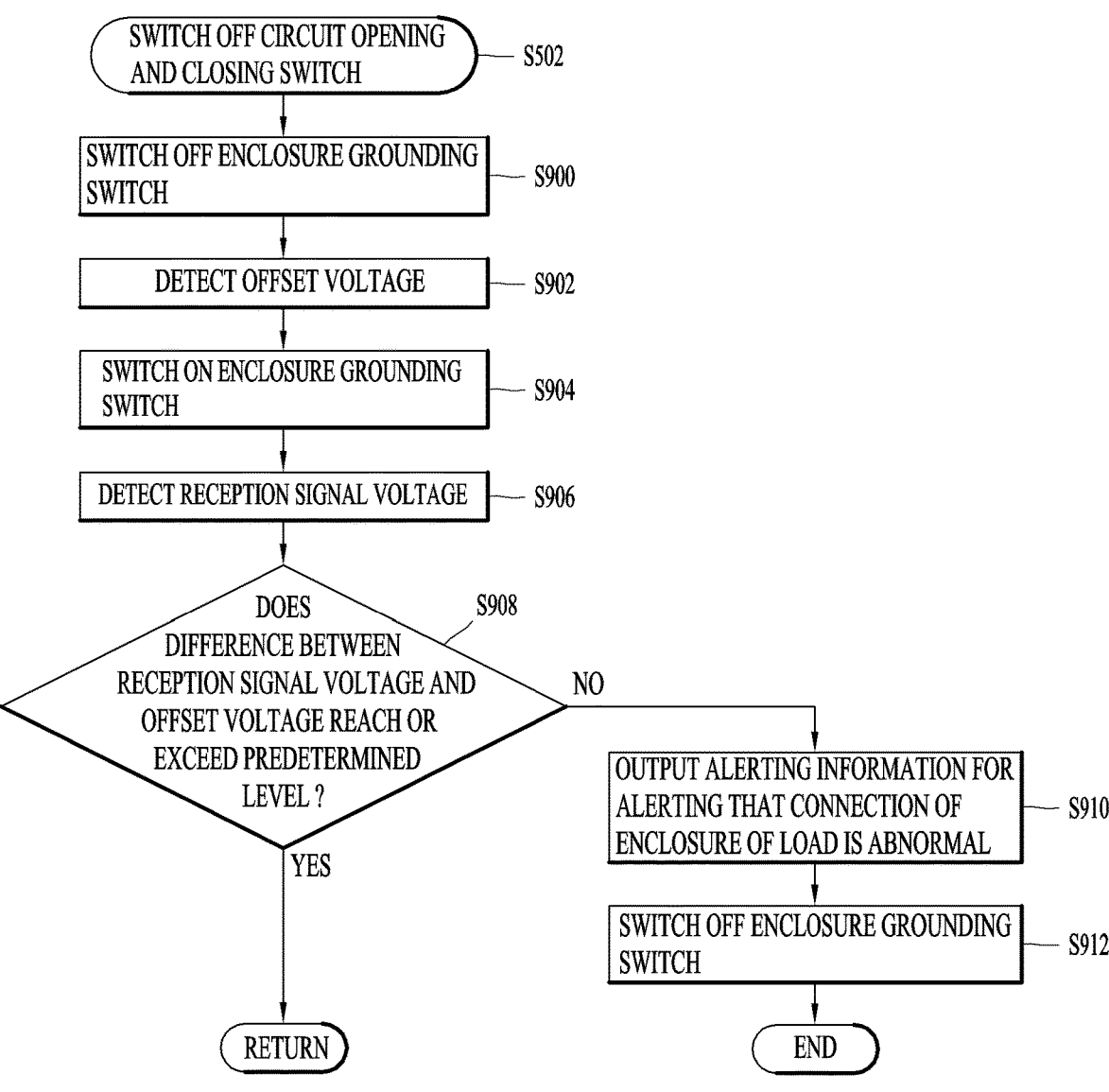
FIG. 9 is a flowchart illustrating a process in which the insulation monitoring device according to the third embodiment of the present disclosure operates to check the connected state to the enclosure of the load through the circuit opening and closing switch connected to the enclosure of the load.

FIG. 9 is a flowchart illustrating a process in which the insulation monitoring device 70 according to the third embodiment of the present disclosure operates to further check the state of the connection between the insulation monitoring device 70 and the enclosure 71 of the load in a state where, in FIG. 5, the circuit opening and closing switch 410 is switched off.

With reference to FIG. 9, when the circuit opening and closing switch 410 is switched off in Step S502 in FIG. 5, the control unit 400 of the insulation monitoring device 70 according to the third embodiment of the present disclosure may switch off the enclosure grounding switch 810 (S902).

When the enclosure grounding switch 810 is switched off, the control unit 400 may detect the reception signal voltage $U_m$ through the signal detection unit 130 (S902). In this case, since the opening and closing circuit 410 is in an open state, the insulation circuit including the transmission line 170, the ground 710, and the insulation resistance 140 may be open. In addition, since the enclosure grounding switch 810 is in a closed state, the enclosure circuit, formed by connecting the signal generation unit 110, the enclosure grounding circuit 720 (formed by connecting the ground 710, the protective earth 120, the enclosure terminal (KE) 820, and the enclosure 71 of the load (the distributing board)), and the detection resistor Rm, may also be open. Therefore, the signal detection unit 130 may detect only the offset voltage as expressed in Mathematical Equation 2.

When the reception signal voltage $U_m$ is detected in Step S902 in a state where the enclosure grounding switch 810 is switched off, the control unit 400 may switch on only the enclosure grounding switch 810 while keeping the circuit opening and closing switch 410 switched off (S904). Then, the insulation circuit may maintain its open state, but the enclosure circuit may be closed. Therefore, the measurement signal applied to the ground 710 through the protective earth 120 may be applied not only to the enclosure 71 of the load through the ground 710, but also to the insulation monitoring device 70 through the enclosure terminal (KE) 820.

When the enclosure grounding switch 810 is switched on, the control unit 400 may again detect the reception signal voltage through the signal detection unit 130 (S906). Then, the signal detection unit 130 may measure, from the enclosure circuit, the reception signal voltage $U_m$ resulting from the measurement signal applied to the enclosure circuit. Then, the reception signal voltage $U_m$ (which refers to the reception signal voltage $U_m$ detected in a state where the enclosure grounding switch 810 is switched on, and this reception signal voltage $U_m$ is hereafter referred to as the reception signal voltage $U_m$) detected in Step S906 and the reception signal voltage $U_m$ (which refers to the reception signal voltage $U_m$ detected in a state where the enclosure grounding switch 810 is switched off, and this reception signal voltage $U_m$ is hereafter referred to as the offset voltage) detected in Step S902 may be compared (S908).

In this case, when the enclosure 71 of the load is in a correctly grounded state, the measurement signal may be applied from the ground 710 to the enclosure grounding circuit 720. The measurement signal applied to the enclosure grounding circuit 720 may be received through the enclosure terminal (KE) 820 connected to the enclosure grounding circuit 720. Accordingly, the reception signal voltage $U_m$ detected in the signal detection unit 130 may be a voltage that is different from the offset voltage. As an example, in a case where a distance between a position at which the enclosure 71 of the load is grounded and a position at which the insulation monitoring device 70 is grounded is sufficiently short, the signal detection unit 130 may detect the reception signal voltage $U_m$ that has a similar magnitude to the voltage Up of the measurement signal.

In contrast, when the enclosure 71 of the load is not in a correctly grounded state, that is, when a connection between the enclosure 71 of the load and the ground 710 or between the enclosure terminal (KE) 820 and the enclosure 71 of the load is disabled, the enclosure circuit may be in an open state even in a case where the enclosure grounding switch 810 is switched on. Therefore, the reception signal voltage $U_m$ detected in the signal detection unit 130 may be the offset voltage.

Therefore, in Step S908, the control unit 400 may compare the detected reception signal voltage $U_m$ and the detected offset voltage. In a case where a difference between the reception signal voltage $U_m$ and the offset voltage reaches or exceeds a predetermined magnitude, it may be determined that the connection between the insulation monitoring device 70 and the enclosure 71 of the load is normal. Then, the control unit 400 may proceed back to Step S504 in FIG. 5 and may perform Step S502 and subsequent steps in FIG. 5.

The predetermined magnitude here that serves as a reference for comparing the reception signal voltage $U_m$ and the offset voltage is used to determine whether or not the reception signal voltage $U_m$ is substantially different form the offset value. The predetermined magnitude may be used to prevent an error in the determination due to noise or the like.

In Step S908, the control unit 400 may compare the detected reception signal voltage $U_m$ and the detected offset voltage. When the result of the comparison is that the difference between the reception signal voltage $U_m$ and the offset voltage does not reach the predetermined magnitude, the control unit 400 may determine that an electrical connection between the enclosure 71 of the load and the insulation monitoring device 70 is abnormal.

In this case, when an accident such as leakage or grounding occurs, current flows through the enclosure 71 of the load. Because of this, there is a risk that accidents such as an electric shock will occur. Accordingly, when as a result of the comparison in Step S908, it is determined that the connection between the enclosure 71 of the load and the insulation monitoring device 70 is abnormal, by controlling the communication unit 106, the control unit 400 may transmit the alerting information for alerting that the connection between the enclosure 71 of load and the insulation monitoring device 70 is abnormal, to the preset server or the terminal used by the manager. Then, by switching off the enclosure grounding switch 810, the control unit 400 may disable the electrical connection between the enclosure 71 of the load and the insulation monitoring device 70.

The circuit opening and closing circuit 410, the enclosure grounding switch 810, or the like according to the third embodiment of the present disclosure may employ a double switching structure that is a master-slave structure.

Figure 10:
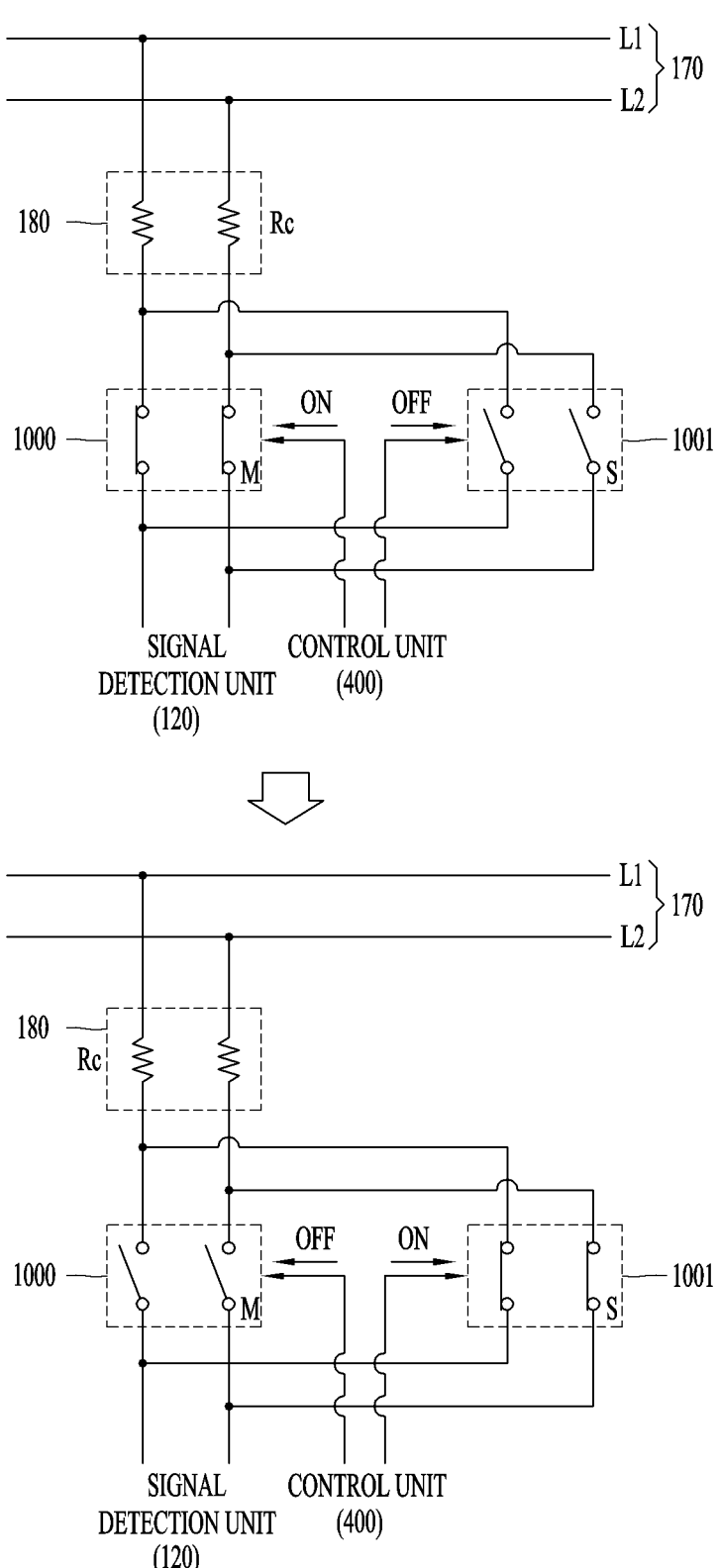
FIG. 10 is a diagram illustrating operation of a master-slave switch in a case where a switch provided to the insulation monitoring device according to the third embodiment of the present disclosure is formed as the master-slave switch.

FIG. 10 is a diagram illustrating operation of a master-slave switch in a case where a switch provided to the insulation monitoring device according to the third embodiment of the present disclosure is formed as the master-slave switch. An example, for convenience in description, the circuit opening and closing switch 410 employing the double switching structure will be described below with reference to FIG. 10. However, the present disclosure is not limited to this opening and closing switch 410.

Normally, in a case where the switch employs the double switching structure, such as a master-slave structure, for example, if a master switch, which is one of the two switches, malfunctions, a slave switch, which is the other one, substitutes for the master switch. Therefore, in a case where a master switch 1000 is configured as a plurality of switches that connect between a plurality of coupler resistors 180 and the signal detection unit 130, respectively, a slave switch 1001 may be configured as a plurality of switches that connect between the plurality of coupler resisters 180 and the signal detection unit 130, respectively, in the same manner as the master switch 1000. Therefore, the master switch 1000 and the slave switch 1011 may be connected in parallel with each other.

In this manner, a normal switch employing a double switching structure, such as a master-slave structure, includes a master switch and a slave switch. An activation signal may be applied to one of the master switch and the slave switch. This normal switch is configured in such a manner that a circuit is formed through one of the master and slave switches to which the activation signal is applied.

However, this normal switch, employing the double switching structure, has a design that maintains a state where each of the master and slave switches connects a circuit regardless of its operating state, thereby further shortening the time required to switch between the master and slave switches. That is, even in a case where the master switch operates, both ends of the slave switch may maintain a state of being connected to each other. Conversely, even in a case where the slave switch operates, both ends of the master switch may maintain each other's connected state.

However, in a structure of the normal switch, in a case where the master switch operates, only the master switch is activated, and thus a circuit is connected only to a path that passes through the master switch. Conversely, in a case where the slave switch operates, only the slave switch is activated, and thus the circuit is connected only to a path that passes through the slave switch. By doing so, in a case where one switch malfunctions, quick switching to a path that passes through the other switch may take place.

However, in this manner, in a case where, regardless of whether or not they are activated, all switches maintain their states where the circuit is closed, resistance may increase due to the connection to the circuit. That is, in a case where the switch, even when in a deactivated state, is in a connected state, the internal resistance of an insulation resistance device may increase due to the resistance of the switch itself. In this case, the insulation resistance may be erroneously computed due to the increasing internal resistance.

Accordingly, regarding the switches of the insulation monitoring device according to the third embodiment of the present disclosure, the control unit 400 may transmit operational signals for performing opposite operations to the master switch 1000 and the slave switch 1001, respectively.

That is, when a switching-on operational signal for switching on one switch is transmitted, a switching-off operational signal for switching off the other switch may be transmitted.

The first portion (the upper portion) of FIG. 10 illustrates an example of a case where the switching-on operational signal is transmitted to the master switch 1000. In this case, the control unit 400 may transmit the switching-off operational signal that is opposite to the switching-on operational signal. Accordingly, as illustrated in the first portion of FIG. 10, the switching-off operational signal may be transmitted to the slave switch 1001. Therefore, when both ends of the master switch 1000 are connected, that is, when the master switch 1000 is closed, the connection between both ends of the slave switch 1001 may be disabled, and thus the salve switch 1001 may be open. That is, when the master switch 1000 is connected to the system, the slave switch 1001 may be separated from the electric power system.

In contrast, as illustrated in the second portion (the lower portion) of FIG. 10, in a case where the switching-on operational signal is transmitted to the slave switch 1001, the control unit 400 may transmit to the master switch 1000 the switching-off operational signal that is opposite to the switching-on operational signal. Accordingly, as illustrated in the second portion of FIG. 10, the switching-off operational signal may be transmitted to the master switch 1000. Therefore, when both ends of the slave switch 1001 are connected, that is, when the slave switch 1001 is closed, the connection between both ends of the master switch 1000 may be disabled, and thus the master switch 1000 may be open. That is, when the slave switch 1001 is connected to the system, the master switch 1000 may be separated from the electric power system.

The example where the control unit 400 transmits opposite operational signals to the master switch 1000 and the slave switch 1001, respectively, is described above. However, the system separation function may refer to a function that is set to be performed by the switch itself.

As an example, the master switch 1000 and the slave switch 1001 may refer to switches in which a switched-off state is set by default. That is, the master switch 1000 and the slave switch 1001 may refer to switches that are in the switched-off state, that is, switches that open the circuit in a case where the control unit 400 does not apply the operational signal to them.

In this case, the control unit 400 may apply the operational signal to only one of the master and slave switches 1000 and 1001. Then, one switch that receives the operational signal may be activated and thus may operate in a switched-on state. A circuit that passes through the one switch may be formed. In this case, the other switch that does not receive the operational signal may maintain its state of being separated from the system by maintaining its switched-off state that is set by default.

In this state, in a case where the control unit 400 applies the operational signal to the other switch, the operational signal may not be applied to the one switch. Then, the one switch may switch to the switched-off state that is set by default and thus may be separated from the electric power system.

The method for controlling an insulation monitoring device according to present disclosure can be implemented as computer-readable codes in a program-recorded medium. The computer-readable medium may include all types of recording devices each storing data readable by a computer system. Examples of the computer-readable medium include a hard disk drive (HDD), a solid state disk (SSD), a silicon disk drive (SDD), a ROM, a RAM, a CD-ROM, a magnetic tape, a floppy disk, an optical data storage device and the like, and may also be implemented in the form of a carrier wave (e.g., transmission over the Internet). Also, the computer may include a controller of the insulation monitoring device. Therefore, the detailed description should not be limitedly construed in all of the aspects, and should be understood to be illustrative. The scope of the present disclosure should be determined by reasonable interpretation of the appended claims, and all changes within the equivalent scope of the present disclosure are embraced by the appended claims.

The invention claimed is:

1. An insulation monitoring device for measuring an insulation resistance between a transmission line and the ground, the insulation monitoring device comprising:
    a signal generation unit configured to generate a measurement signal having a preset voltage and to apply the measurement signal to the ground through a protective earth connected to one end thereof;
    a coupler resistor connected to the transmission line;
    a signal detection unit including a detection resistor provided between the coupler resistor and the other end of the signal generation unit and configured to detect a voltage of the measurement signal that is distributed to the internal resistance of the insulation monitoring device, the internal resistance being formed by the resistance of the coupler resistor and the resistance of the detection resistor according to a difference between voltages of both ends of the detection resistor; and
    a control unit configured to detect, from the voltage detected in the signal detection unit, a transient voltage due to charging and discharging of a system capacitor formed by parasite capacitance between the transmission line and the ground, and to check a connected state of the insulation monitoring device to the transmission line and the ground, based on the result of detecting the transient voltage.

2. The insulation monitoring device of claim 1, wherein the control unit detects a normal-state voltage from the voltage detected in the signal detection unit and detects, as the transient voltage, a voltage that is higher, by a preset magnitude or greater, than the detected normal-state voltage.

3. The insulation monitoring device of claim 2, wherein the control unit detects, with a period of the preset time, the transient voltage from the voltage detected in the signal detection unit, and the preset time is determined at least one of the following: a shape of the measurement signal or a period of the measurement signal.

4. The insulation monitoring device of claim 2, wherein the control unit determines sampling periods of time that vary with a preset time constant, computes average voltages of voltages that are detected in the signal detection unit during the sampling periods of time, respectively, and detects the normal-state voltage based on a difference between the computed average voltages.

5. The insulation monitoring device of claim 2, wherein, in a case where the voltage that is higher, by the preset magnitude or greater, than the normal-state voltage is detected, the control unit detects whether or not a magnitude of the detected voltage changes by a predetermined magnitude or greater for a predetermined time, and determines, further based on a change in the magnitude of the detected voltage, whether or not the transient voltage occurs.

6. The insulation monitoring device of claim 1, further comprising:
    a communication unit configured to establish a connection to a preset server or terminal for communication, wherein, based on the result of detecting the transient voltage, the control unit controls the communication unit in such a manner as to transmit alerting information for alerting that the connected state of the insulation monitoring device is abnormal, to the server or terminal.

7. A method of controlling an insulation monitoring device for measuring the resistance of an insulation resistance between a transmission line and the ground, the method comprising steps of:
    generating a measurement signal having a preset voltage and applying the measurement signal to the ground;
    detecting, based on the resistance of a preset detection resistor, a voltage of the measurement signal that is distributed to the internal resistance of the insulation monitoring device, the internal resistance being formed by the resistance of a coupler resistor, connected to the transmission line, and the resistance of the detection resistor;
    determining whether or not a voltage detected through the detection resistor is a normal-state voltage;
    detecting whether or not a transient voltage occurs, from a voltage that is detected through the detection resistor for a preset time, in a case where the voltage detected through the detection resistor is the normal-state voltage; and
    determining a connected state of the insulation monitoring device to the transmission line and the ground, based on whether or not the transient voltage occurs.

8. The method of claim 7, wherein the step of detecting whether or not the transient voltage occurs comprises steps of:
    computing a voltage difference between the voltage detected through the detection resistor and the normal-state voltage;
    comparing the computed voltage difference and a voltage value of preset magnitude; determining that the transient voltage occurs, in a case where, as a result of the comparison, the computed voltage difference is at or above the voltage value of preset magnitude; and determining that the transient voltage does not occur, in a case where, as a result of the comparison, the computed voltage difference is below the voltage value of preset magnitude.

9. The method of claim 7, wherein the step of determining whether or not the voltage detected through the detection resistor is the normal-state voltage comprises steps of:
    determining a sampling period of time that varies with a preset time constant;
    computing an average voltage of voltages that are detected during the sampling periods of time;
    computing a difference between the average voltage and an average voltage of voltages that are detected during the preceding sampling period of time;
    comparing the computed difference and a preset error; and
    determining, as the normal-state voltage, the average voltage of the voltages detected during the sampling period of time, or reperforming the step of computing the sampling period of time, the step of computing the average voltage, the step of computing the difference between the average voltages, and the step of comparing the computed difference and the preset error, based on the result of the comparison.

10. The method of claim 7, wherein the step of determining the connected state of the insulation monitoring device to the transmission line and the ground comprises a step of:

transmitting alerting information for alerting that the connected state of the insulation monitoring device is abnormal, to a preset server or terminal, in a case where the transient voltage does not occur for the preset time.

11. An insulation monitoring device for measuring the resistance of an insulation resistance between a transmission line and the ground, the insulation monitoring device comprising:

a signal generation unit configured to generate a measurement signal having a preset voltage and to apply the measurement signal to the ground through a protective earth connected to one end thereof;

a coupler resistor connected to the transmission line;

a signal detection unit including a detection resistor provided between the coupler resistor and the other end of the signal generation unit and configured to detect a voltage of the measurement signal that is distributed to the internal resistance of the insulation monitoring device, the internal resistance being formed by the resistance of the coupler resistor and the resistance of the detection resistor according to a difference between voltages of both ends of the detection resistor;

a circuit opening and closing switch configured to connect between the coupler resistor and the detection resistor and to disable a connection between the coupler resistor and the detection resistor; and a control unit configured to control the circuit opening and closing switch, to detect whether or not a second voltage that is detected in the signal detection unit in a state where the coupler resistor and the detection resistor are connected by the circuit opening and closing switch contains a transient voltage, based on a first voltage that is detected in the signal detection unit in a state where the connection between the coupler resistor and the detection resistor is disabled by the circuit opening and closing switch, and to check the connected state of the insulating monitoring device to the transmission line and the ground, based on the result of detecting the transient voltage.

12. The insulation monitoring device of claim 11, wherein the first voltage is a preset offset voltage that is applied to the signal detection unit, and, in a case where the second voltage is higher, by a preset voltage value or higher, than the offset voltage, the control unit determines that the second voltage contains the transient voltage.

13. The insulation monitoring device of claim 11, wherein the transmission line includes a plurality of lines, the coupler resistors are connected to the plurality of lines, respectively, and the circuit opening and closing switch is configured as a plurality of switches that are formed between the different coupler resistors and the detection resistor, respectively, the coupler different resistors being connected to the plurality of lines, respectively.

14. The insulation monitoring device of claim 13, wherein, by controlling all the switches, the control unit detects, as the first voltage, a voltage that is detected through the signal detection unit in a state where the connection between each of the coupler resistors and the detection resistor is disabled, connects between a first coupler resistor connected to a first switch and the detection resistor by selecting the first switch from among the plurality of switches and controlling the first switch, detects, as the second voltage, a voltage that is detected from the voltage detected in the signal detection unit when the first coupler resistor and the detection resistor are connected to each other, detects whether or not the second voltage contains the transient voltage, based on the first voltage, and checks a connected state of the insulation monitoring device to one of the plurality of lines connected to the first coupler resistors, respectively, based on whether or not the second voltage contains the transient voltage.

15. The insulation monitoring device of claim 14, further comprising:

a communication unit configured to establish a connection to a preset server or terminal for communication, wherein the control unit controls the communication unit in such a manner as to transmit alerting information for alerting that the connected state of the insulation monitoring device is abnormal, to the server or terminal, based on the result of detecting the transient voltage, and the alerting information includes information on the connected state of the insulation monitoring device to one of the plurality of lines.

16. The insulation monitoring device of claim 11, further comprising:

an enclosure terminal connected to an enclosure of a load; and an enclosure grounding switch connected to the detection resistor and connecting between the enclosure terminal and the detection resistor or disabling the connection between the detection resistor and the enclosure terminal.

17. The insulation monitoring device of claim 16, wherein the control unit controls the enclosure grounding switch in such a manner that the connection between the enclosure terminal and the detection resistor is disabled, in a state where the connection between the coupler resistor and the detection resistor is disabled by the circuit opening and closing switch, wherein the control unit detects an offset voltage based on a voltage that is detected through the signal detection unit in a state where the connection between the enclosure terminal and the detection resistor is disabled, and wherein the control unit controls the enclosure grounding switch in such a manner to connect between the enclosure terminal and the detection resistor, in a state where the connection between the coupler resistor and the detection resistor is disabled, and further checks a connected state of the insulating monitoring device to the enclosure of the load based on the result of comparing a voltage detected through the signal detection unit in a state where the enclosure terminal and the detection resistor are connected and the offset voltage.

18. A method of controlling an insulating monitoring device including a circuit opening and closing switch enabling and disabling a connection between a coupler resistor connected to a transmission line and a preset detection resistor, and a signal detection unit including the preset detection resistor, the method comprising steps of:

generating a measurement signal having a preset voltage and applying the measurement signal to the ground;

disabling a connection between the coupler resistor and the preset detection resistor by controlling the circuit opening and closing switch;

detecting an offset voltage based on a voltage detected in the signal detection unit, in a case where the connection between the coupler resistor and the preset detection resistor is disabled;

connecting between the coupler resistor and the preset detection resistor by controlling the circuit opening and closing switch; and detecting whether or not the voltage detected through the signal detection unit contains a transient voltage, based on the offset voltage, and determining a connected state of the insulation monitoring device to the transmission line and the ground, based on whether or not the voltage detected through the signal detection unit contains the transient voltage.

19. The method of claim 18, wherein the insulation monitoring device further comprises:

an enclosure terminal connected to an enclosure of a load; and an enclosure grounding switch connected to the preset detection resistor and connecting between the enclosure terminal and the preset detection resistor or disabling the connection between the preset detection resistor and the enclosure terminal, and wherein the step of disabling the connection between the coupler resistor and the preset detection resistor comprises steps of:

disabling the connection between the enclosure terminal and the preset detection resistor by controlling the enclosure grounding switch, in a state where the connection between the coupler resistor and the preset detection resistor is disabled;

detecting the offset voltage based on the voltage detected through the signal detection unit;

connecting between the enclosure terminal and the preset detection resistor by controlling the enclosure grounding switch;

comparing the voltage detected through the signal detection unit and the offset voltage; and checking a connected state of the insulation monitoring device to the enclosure of the load based on the result of the comparison.

20. The method of claim 18, wherein the transmission line includes a plurality of lines, the coupler resistors are connected to the plurality of lines, respectively, and the circuit opening and closing switch is configured as a plurality of switches that are formed between the different coupler resistors and the preset detection resistor, respectively, the different coupler resistors being connected to the plurality of lines, respectively, wherein the step of connecting the coupler resistor and the preset detection resistor is a step of sequentially selecting one switch from among the plurality of switches and controlling the selected switch in such a manner as to connect between the coupler resistor connected to the selected switch and the preset detection resistor, and wherein the step of determining the connected state of the insulation monitoring device to the transmission line and the ground is a step of determining a connected state of the insulation monitoring device to one of the plurality of lines, which is connected to a specific coupler resistor, based on whether or not whether or not the voltage detected in the signal detection unit contains the transient voltage, when the specific coupler resistor and the preset detection resistor are connected to each other.

21. The method of claim 20, wherein the step of determining the connected state of the insulation monitoring device to the transmission line and the ground comprises a step of:

transmitting alerting information for alerting that the connected state of the insulation monitoring device is abnormal, to a preset server or terminal, based on whether or not the voltage detected in the signal detection unit contains the transient voltage, and wherein the alerting information includes information on a connected state of the insulation monitoring device to each of the plurality of lines.

\* \* \* \* \*